United States Patent
Ishibashi

(10) Patent No.: US 10,199,335 B2
(45) Date of Patent: Feb. 5, 2019

(54) ELECTRONIC DEVICE INCLUDING COUPLING STRUCTURE ALONG WITH WAVEGUIDE, AND ELECTRONIC EQUIPMENT

(71) Applicant: FUJITSU LIMITED, Kawasaki-shi, Kanagawa (JP)

(72) Inventor: Daijiro Ishibashi, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 5 days.

(21) Appl. No.: 15/448,866

(22) Filed: Mar. 3, 2017

(65) Prior Publication Data
US 2017/0263578 A1 Sep. 14, 2017

(30) Foreign Application Priority Data
Mar. 10, 2016 (JP) ................. 2016-046892

(51) Int. Cl.
*H01L 23/00* (2006.01)
*H01L 23/66* (2006.01)
*H01L 23/498* (2006.01)

(52) U.S. Cl.
CPC ........ *H01L 23/66* (2013.01); *H01L 23/49811* (2013.01); *H01L 23/49838* (2013.01); *H01L 24/16* (2013.01); *H01L 2223/6611* (2013.01); *H01L 2223/6627* (2013.01); *H01L 2223/6683* (2013.01); *H01L 2224/16104* (2013.01);
(Continued)

(58) Field of Classification Search
CPC .............. H01L 23/66; H01L 23/49811; H01L 23/49838; H01L 24/16; H01L 2223/6611; H01L 2223/6627; H01L 2223/6683; H01L 2924/19032; H01L 24/17; H01L 2224/16104; H01L 2224/16501
USPC ....................................................... 257/664
See application file for complete search history.

(56) References Cited

U.S. PATENT DOCUMENTS

| | | | |
|---|---|---|---|
| 8,680,689 B1* | 3/2014 | Daubenspeck | H01P 3/003 257/774 |
| 2007/0085636 A1* | 4/2007 | Tamaki | H01P 1/042 333/254 |

(Continued)

FOREIGN PATENT DOCUMENTS

| JP | 2013-102356 A1 | 5/2013 |
|---|---|---|
| JP | 2013-126099 A1 | 6/2013 |

(Continued)

*Primary Examiner* — Didarul Mazumder
(74) *Attorney, Agent, or Firm* — Kratz, Quintos & Hanson, LLP

(57) ABSTRACT

An electronic device includes a first electronic component including a first signal line and a first ground conductor surface, a second electronic component that is placed above the first electronic component and includes a second signal line and a second ground conductor surface opposed to the first ground conductor surface, a waveguide including the first ground conductor surface, the second ground conductor surface, and a pair of first ground conductor walls that are opposed to each other and are placed between the first ground conductor surface and the second ground conductor surface, a first transducing part that transduces a signal between the first signal line and the waveguide, and a second transducing part that transduces a signal between the second signal line and the waveguide.

4 Claims, 18 Drawing Sheets

(52) U.S. Cl.
CPC ............... *H01L 2224/16501* (2013.01); *H01L 2924/19032* (2013.01)

(56) References Cited

U.S. PATENT DOCUMENTS

| | | | |
|---|---|---|---|
| 2008/0100394 A1* | 5/2008 | Margomenos | H01P 1/047 333/32 |
| 2011/0140810 A1* | 6/2011 | Leiba | H01P 3/121 333/239 |
| 2013/0154759 A1 | 6/2013 | Morita | |
| 2013/0256849 A1* | 10/2013 | Danny | H01L 23/66 257/664 |
| 2013/0265733 A1* | 10/2013 | Herbsommer | H01P 3/16 361/774 |
| 2013/0265734 A1 | 10/2013 | Herbsommer | |
| 2014/0211441 A1 | 7/2014 | Tsukizawa | |
| 2015/0318597 A1* | 11/2015 | Park | H05K 1/0242 333/26 |

FOREIGN PATENT DOCUMENTS

| | | |
|---|---|---|
| JP | 2014-187424 A1 | 10/2014 |
| JP | 2015-515213 A1 | 5/2015 |

\* cited by examiner

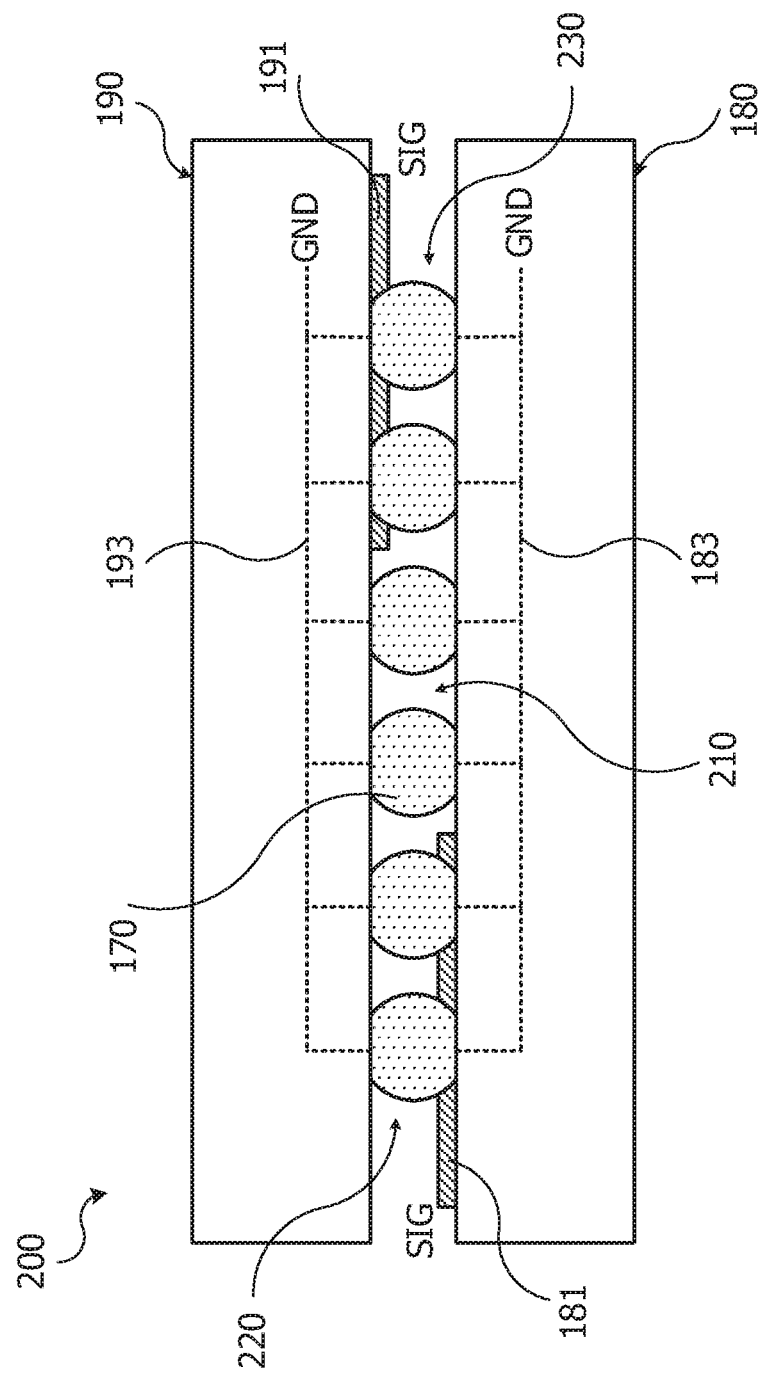

ELECTRONIC DEVICE INCLUDING COUPLING STRUCTURE ALONG WITH WAVEGUIDE, AND ELECTRONIC EQUIPMENT

CROSS-REFERENCE TO RELATED APPLICATION

This application is based upon and claims the benefit of priority of the prior Japanese Patent Application No. 2016-046892, filed on Mar. 10, 2016, the entire contents of which are incorporated herein by reference.

FIELD

The embodiments discussed herein are related to an electronic device and electronic equipment.

BACKGROUND

There is a technique of flip-chip coupling of electronic components such as a semiconductor chip and a circuit board. The flip-chip coupling may couple the electronic components at a short distance and thus is also utilized for coupling electronic components for the purpose of a high frequency wave such as a microwave or a milliwave in terms of shortening of the signal transmission distance, reduction in the signal transmission loss, and so forth.

In the flip-chip coupling of electronic components, the coupling distance may be shortened and reduction in the loss of the transmission signal may be achieved by miniaturizing the coupling part between the electronic components. However, the miniaturization of the coupling part possibly causes increase in the mounting cost attributed to miniaturization of bumps provided on the electronic component (components) before the coupling, insufficiency in the strength of the coupling part, characteristic deterioration due to provision of a component for covering the strength insufficiency, and so forth.

The following is a reference document.
[Document 1] Japanese Laid-open Patent Publication No. 2013-102356.

SUMMARY

According to an aspect of the embodiments, an electronic device includes: a first electronic component including a first signal line and a first ground conductor surface; a second electronic component that is placed above the first electronic component and includes a second signal line and a second ground conductor surface opposed to the first ground conductor surface; a waveguide including the first ground conductor surface, the second ground conductor surface, and a pair of first ground conductor walls that are opposed to each other and are placed between the first ground conductor surface and the second ground conductor surface; a first transducing part that transduces a signal between the first signal line and the waveguide; and a second transducing part that transduces a signal between the second signal line and the waveguide.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 17 depicts a diagram illustrating a configuration example of an electronic device.

DESCRIPTION OF EMBODIMENTS

First, a description will be made about a coupling structure between electronic components.

Here, the coupling structure of an electronic device will be described by taking as an example the electronic device including the coupling structure between a semiconductor device and a circuit board in which a high frequency wave such as a microwave, a milliwave, or a terahertz wave is used. As one example, the electric device includes the coupling structure between a monolithic microwave integrated circuit (MMIC) chip and a printed wiring board.

Figure 1A:
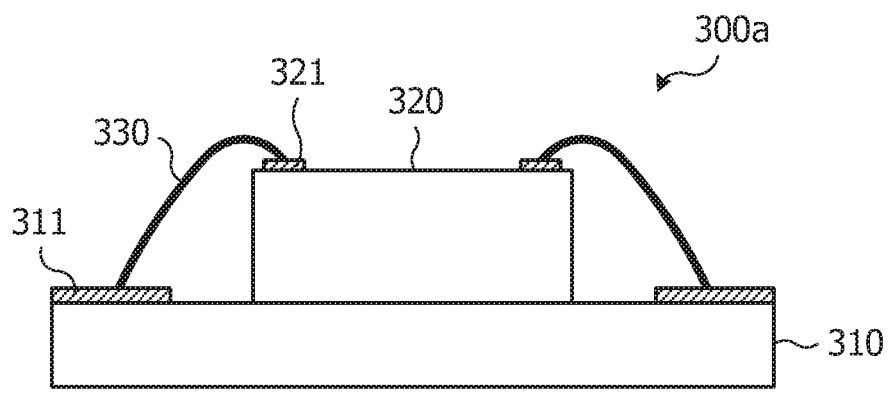
FIGS. 1A and 1B depict explanatory diagrams of electronic devices.
Figure 1B:
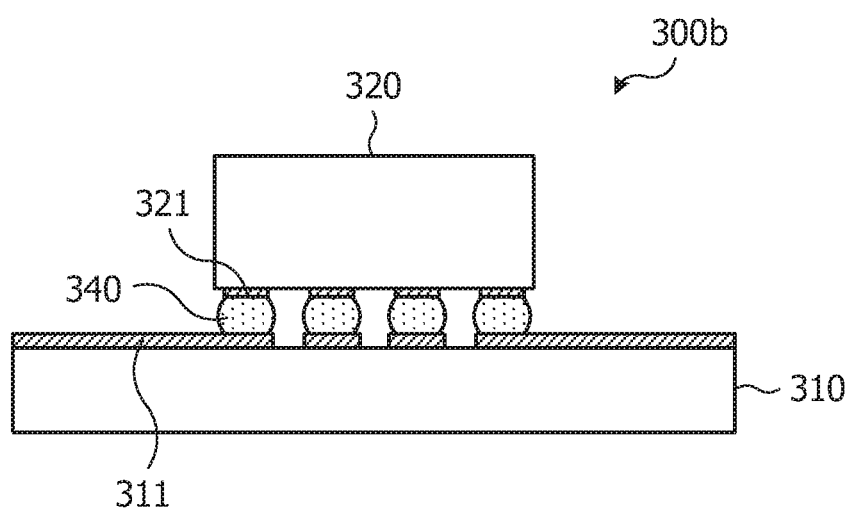

FIG. 1 depicts explanatory diagrams of electronic devices. FIG. 1A is a sectional schematic diagram of the major part of one example of an electronic device that employs wire coupling. FIG. 1B is a sectional schematic diagram of the major part of one example of an electronic device that employs flip-chip coupling.

An electronic device 300a illustrated in FIG. 1A includes a printed wiring board 310 and an MMIC chip 320. In the electronic device 300a, electrodes 311 (signal lines) provided on the printed wiring board 310 and electrodes 321 (signal lines) provided on the MMIC chip 320 are coupled by wires 330. The electronic device 300a includes such a wire coupling structure between the printed wiring board 310 and the MMIC chip 320.

An electronic device 300b illustrated in FIG. 1B includes the printed wiring board 310 and the MMIC chip 320. In the electronic device 300b, the electrodes 311 (signal lines) provided on the printed wiring board 310 and the electrodes 321 (signal lines) provided on the MMIC chip 320 are coupled by coupling parts 340 such as solder bumps. The electronic device 300b includes such a flip-chip coupling structure between the printed wiring board 310 and the MMIC chip 320.

With the high frequency wave, signal transmission characteristics between the printed wiring board 310 and the MMIC chip 320 are greatly affected by reflection and loss due to an impedance mismatch at the coupling site between the printed wiring board 310 and the MMIC chip 320. This is because the wavelength of the high frequency wave is short and thus the coupling site is regarded as a distributed constant circuit.

For example, in the coupling by the wires 330 illustrated in FIG. 1A, the coupling distance between the printed wiring board 310 and the MMIC chip 320 is comparatively long and it is difficult to ignore the inductance of the wires 330 themselves. For this reason, it is difficult to use the wire coupling for signal transmission of a high frequency wave in some cases. In contrast, in the coupling by the coupling parts 340 illustrated in FIG. 1B, the coupling distance between the printed wiring board 310 and the MMIC chip 320 may be set comparatively short. For this reason, the flip-chip coupling is advantageous over the wire coupling in terms of suppression of the signal transmission loss of the high frequency wave.

As one of measures to suppress the influence due to the wavelength of the high frequency wave in such flip-chip coupling between the printed wiring board 310 and the MMIC chip 320, reducing the dimensions of the coupling parts 340 to thereby shorten the coupling distance is cited.

Figure 2A:
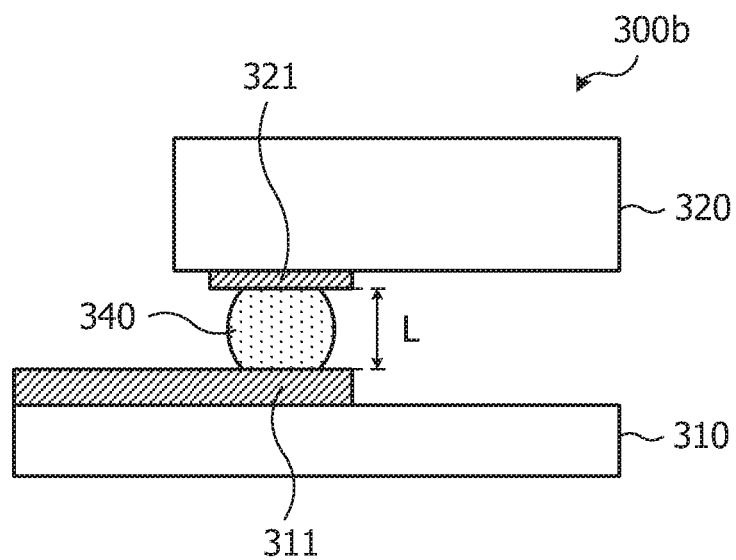
FIGS. 2A and 2B depict explanatory diagrams of an electronic device that employs flip-chip coupling.
Figure 2B:
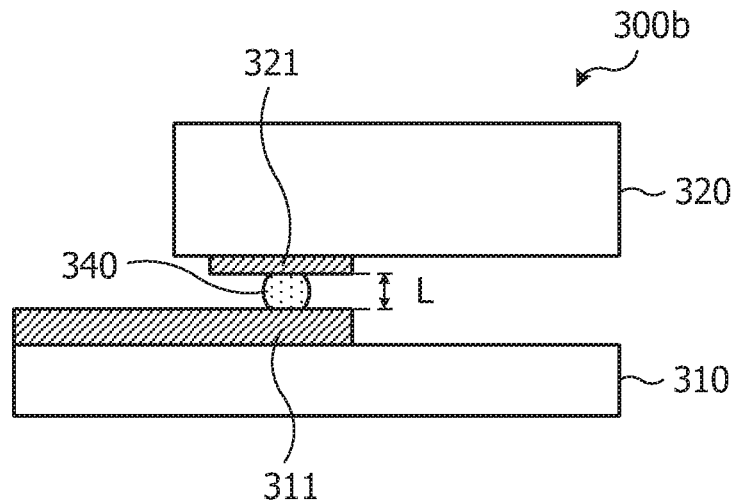

FIG. 2 depicts explanatory diagrams of an electronic device that employs flip-chip coupling. FIG. 2A and FIG. 2B are each a sectional schematic diagram of the major part of one example of the electronic device that employs the flip-chip coupling.

FIG. 2A exemplifies the electronic device 300b of the case in which the electrode 311 of the printed wiring board 310 and the electrode 321 of the MMIC chip 320 are coupled by the coupling part 340 having comparatively large dimensions. FIG. 2B exemplifies the electronic device 300b of the case in which the electrode 311 of the printed wiring board 310 and the electrode 321 of the MMIC chip 320 are coupled by the coupling part 340 having comparatively small dimensions. Even in the same flip-chip coupling, coupling distance L between the printed wiring board 310 and the MMIC chip 320 becomes shorter when the dimensions of the coupling part 340 become smaller. Reduction in the signal transmission loss may be achieved by reducing the dimensions of the coupling part 340 to shorten the coupling distance L between the printed wiring board 310 and the MMIC chip 320.

It is said that the coupling distance L with which the influence due to the wavelength of the high frequency wave becomes ignorable is approximately 1/20 to 1/10 of the wavelength. For example, with a milliwave of 77 GHz, the wavelength in free space is approximately 4 mm and the length of 1/20 to 1/10 of the wavelength is 0.2 to 0.4 mm. This is a coupling height (coupling distance L) that may be realized in the flip-chip coupling. However, what is represented by this length is a dimension at the boundary of whether the influence due to the wavelength appears and thus a lower coupling height is requested for realization of the electronic device 300b having higher performance. On the other hand, with a terahertz wave of a higher frequency of 300 GHz, the wavelength in free space becomes shorter to be approximately 1 mm and the length of 1/20 to 1/10 of the wavelength is 0.05 to 0.1 mm. When the coupling distance L becomes this level of dimension, flip-chip coupling of the minute coupling parts 340 is requested.

Miniaturization of the coupling parts 340 possibly causes increase in the mounting cost because of disposing of minute terminals on the side of the MMIC chip 320 or the side of the printed wiring board 310 or both before coupling, coupling with suppression of failure at the time of the coupling or after the coupling, and so forth. Moreover, the miniaturization of the coupling parts 340 possibly causes the lowering of the strength of the coupling parts 340 and thus reinforcement by a component like an underfill material may also be carried out. However, with the high frequency wave, the reinforcement by such a component possibly has influence on signal transmission characteristics, such as increase in the parasitic capacitance and the shift of the frequency characteristics and the lowering of the gain in the MMIC chip 320 due to the increase in the parasitic capacitance.

In the case of a high frequency wave beyond the milliwave, favorable signal transmission is difficult even with the flip-chip coupling by the coupling parts 340 in some cases.

In view of the above-described points, configurations represented below as embodiments are employed here and an electronic device having a coupling structure with which signal transmission with low loss may be carried out with suppression of miniaturization of coupling parts between electronic components and electronic equipment including such an electronic device are realized.

First, a first embodiment will be described.

Here, an electronic device including a printed wiring board and an MMIC chip is employed as an example as with the above description.

Figure 3:
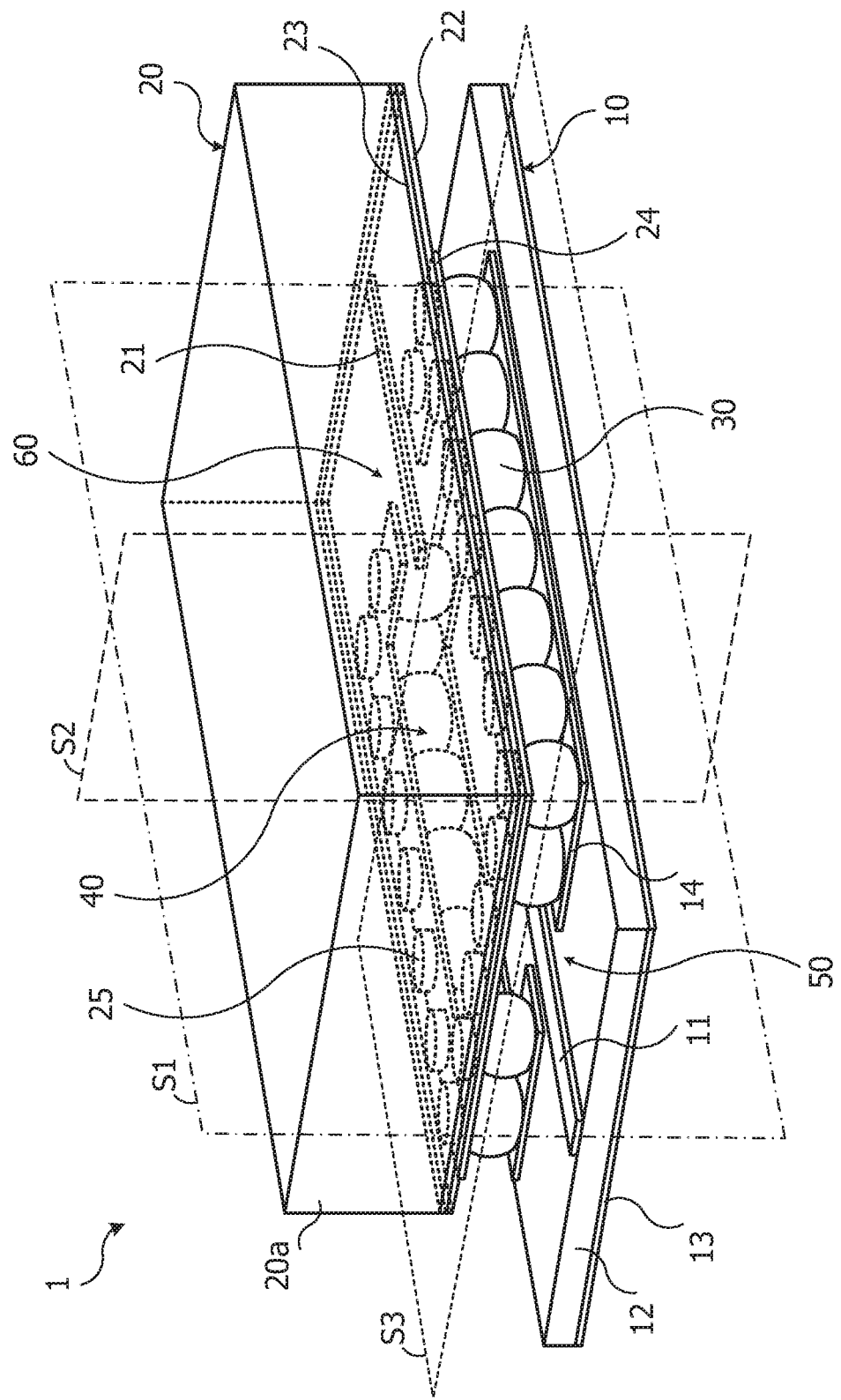
FIG. 3 depicts a diagram (first diagram) illustrating one example of an electronic device according to a first embodiment.
Figure 4A:
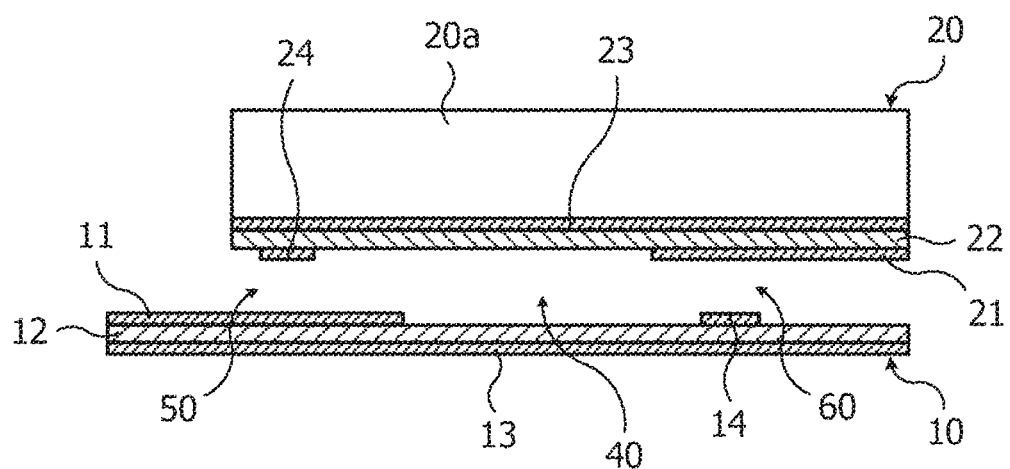
FIGS. 4A and 4B depict diagrams (second diagrams) illustrating examples of an electronic device according to the first embodiment.
Figure 4B:
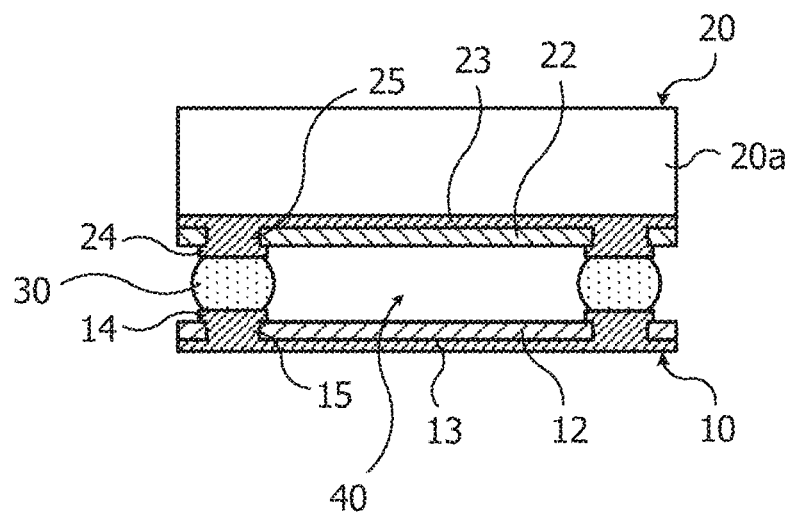
Figure 5A:
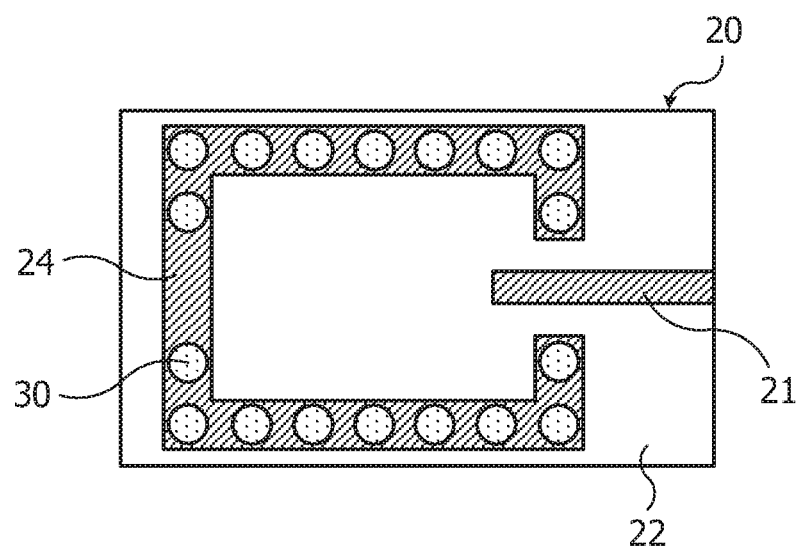
FIGS. 5A and 5B depict diagrams (third diagrams) illustrating examples of an electronic device according to the first embodiment.
Figure 5B:
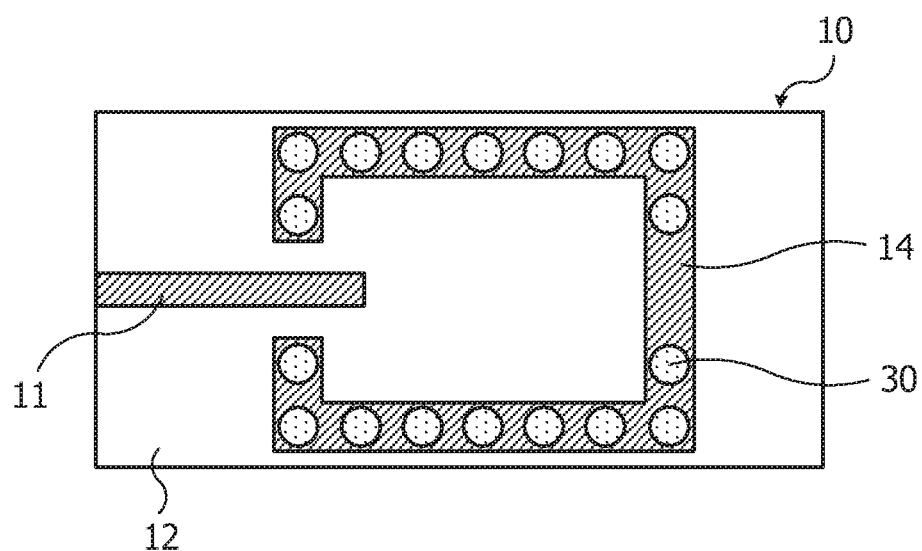

FIG. 3 to FIG. 5 are diagrams illustrating examples of an electronic device according to the first embodiment. FIG. 3 is a perspective schematic diagram of the major part of the one example of the electronic device according to the first embodiment. FIG. 4A is a sectional schematic diagram along a plane S1 in FIG. 3 and FIG. 4B is a sectional schematic diagram along a plane S2 in FIG. 3. FIG. 5A is a planar schematic diagram when a section along a plane S3 in FIG. 3 is viewed toward the MMIC chip and FIG. 5B is a planar schematic diagram when the section along the plane S3 in FIG. 3 is viewed toward the printed wiring board.

As illustrated in FIG. 3, an electronic device 1 includes a printed wiring board 10 and an MMIC chip 20.

The printed wiring board 10 includes a signal line 11, a dielectric layer 12, and a conductor layer 13 as illustrated in FIG. 3. As illustrated in FIG. 3, FIG. 4A, and FIG. 4B, the conductor layer 13 is provided on one surface of the dielectric layer 12 and the signal line 11 is provided on the other surface of the dielectric layer 12 opposed to the conductor layer 13. For the dielectric layer 12, various kinds of insulating materials may be used, and organic insulating materials such as epoxy and polyimide and inorganic insulating materials such as silicon oxide and silicon nitride may be used. For the conductor layer 13 and the signal line 11, various kinds of conductor materials may be used and, for example, copper (Cu) may be used. The conductor layer 13 is a conductor layer (ground conductor surface) whose potential becomes the ground potential when the electronic device 1 operates. The signal line 11 is a signal line with which signal transmission is carried out with a signal line 21 of the MMIC chip 20 to be described later. The transmission line of the signal of the printed wiring board 10 is a microstripline designed to have characteristic impedance of 50 Ω, for example.

The printed wiring board 10 further includes a conductor layer 14, for example, in the same layer as the signal line 11 as illustrated in FIG. 3 and FIG. 4A. The conductor layer 14 is electrically coupled to the conductor layer 13 through conductor parts 15 such as vias as illustrated in FIG. 4B. For the conductor layer 14 and the conductor parts 15, various kinds of conductor materials may be used and, for example, copper may be used. The potential of the conductor layer 14 and the conductor parts 15 electrically coupled to the conductor layer 13 becomes the ground potential when the electronic device 1 operates (ground conductor). In FIG. 5B, a plane when the section along the plane S3 in FIG. 3 is viewed toward the printed wiring board 10 is schematically illustrated. The conductor layer 14 has a loop pattern shape disposed without contact with the signal line 11.

The printed wiring board 10 includes the above-described structure illustrated in FIG. 3 to FIG. 5 at least in a superficial part on the surface side coupled to the MMIC chip 20.

The MMIC chip 20 mounted on the printed wiring board 10 includes the signal line 21, a dielectric layer 22, and a conductor layer 23 as illustrated in FIG. 3. As illustrated in FIG. 3, FIG. 4A, and FIG. 4B, the conductor layer 23 is provided on one surface of the dielectric layer 22 and the signal line 21 is provided on the other surface of the dielectric layer 22 opposed to the conductor layer 23. For the dielectric layer 22, various kinds of insulating materials may be used, and organic insulating materials such as epoxy and polyimide and inorganic insulating materials such as silicon oxide and silicon nitride may be used. For the conductor layer 23 and the signal line 21, various kinds of conductor materials may be used and, for example, copper may be used. The conductor layer 23 is a conductor layer (ground conductor surface) whose potential becomes the ground potential when the electronic device 1 operates. The signal line 21 is a signal line with which signal transmission is carried out with the signal line 11 of the above-described printed wiring board 10. The transmission line of the signal of the MMIC chip 20 is a microstripline designed to have characteristic impedance of 50 Ω, for example.

The MMIC chip 20 further includes a conductor layer 24, for example, in the same layer as the signal line 21 as illustrated in FIG. 3 and FIG. 4A. The conductor layer 24 is electrically coupled to the conductor layer 23 through conductor parts 25 such as vias as illustrated in FIG. 3 and FIG. 4B. For the conductor layer 24 and the conductor parts 25, various kinds of conductor materials may be used and, for example, copper may be used. The potential of the conductor layer 24 and the conductor parts 25 electrically coupled to the conductor layer 23 becomes the ground potential when the electronic device 1 operates (ground conductor). In FIG. 5A, a plane when the section along the plane S3 in FIG. 3 is viewed toward the MMIC chip 20 is schematically illustrated. The conductor layer 24 has a loop pattern shape disposed at a position corresponding to the conductor layer 14 provided in the printed wiring board 10 without contact with the signal line 21.

The MMIC chip 20 includes the structure including the above-described signal line 21, dielectric layer 22, conductor layer 23, conductor layer 24, and conductor parts 25 in a superficial part on the surface side coupled to the printed wiring board 10, for example, in a wiring layer provided on a main body part 20a or part of the wiring layer. It is to be noted that the main body part 20a is a part in which various kinds of circuit elements such as transistors are formed.

The conductor layer 14 of the printed wiring board 10 and the conductor layer 24 of the MMIC chip 20 are coupled through plural coupling parts 30 as illustrated in FIG. 3 and so forth. For the coupling parts 30, various kinds of conductor materials may be used and, for example, a solder material may be used. In the electronic device 1, the ground conductors of the printed wiring board 10 and the MMIC chip 20 are electrically coupled by the coupling parts 30. In addition, the printed wiring board 10 and the MMIC chip 20 are mechanically coupled by the coupling parts 30. In the electronic device 1, the signal line 11 of the printed wiring board 10 and the signal line 21 of the MMIC chip 20 are not directly coupled physically.

Figure 6A:
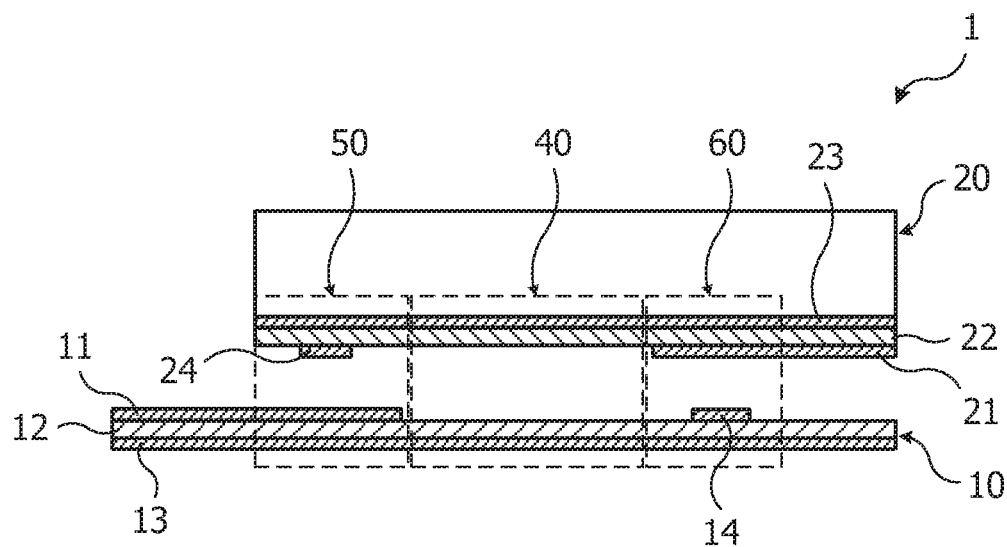
FIGS. 6A and 6B depict explanatory diagrams of an electronic device according to the first embodiment.
Figure 6B:
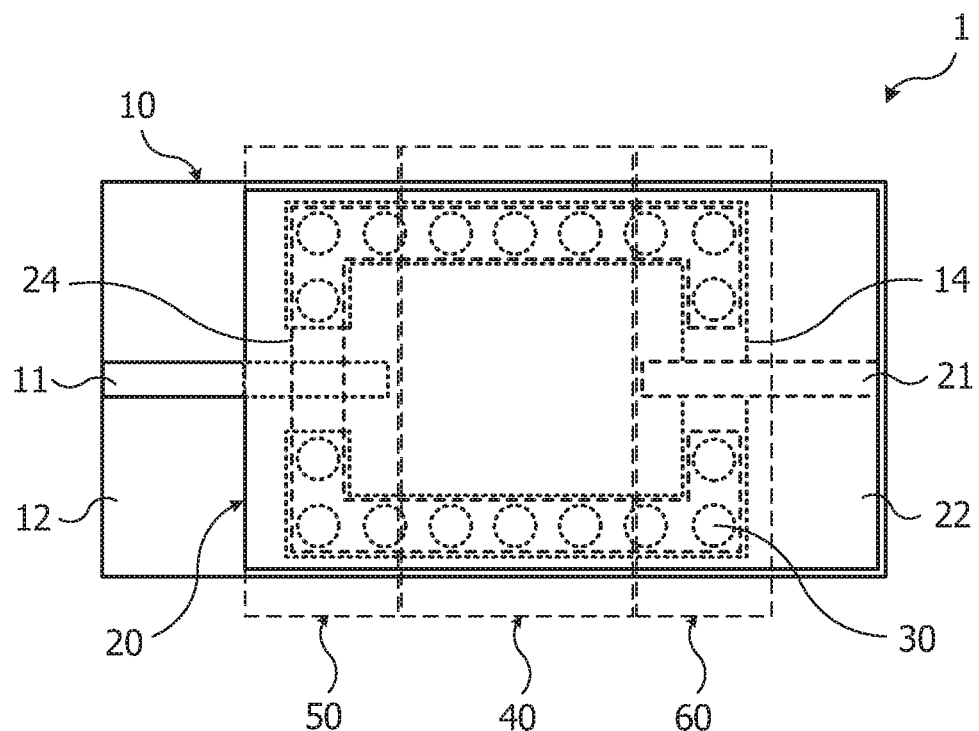

FIG. 6 depicts explanatory diagrams of an electronic device according to the first embodiment. FIG. 6A is a sectional schematic diagram of the major part of the one example of the electronic device according to the first embodiment and FIG. 6B is a planar schematic diagram of the major part of the one example of the electronic device according to the first embodiment.

In the electronic device 1 (FIG. 3 to FIG. 5), as illustrated in FIG. 6A and FIG. 6B, a waveguide 40 is formed by the conductor layer 13 (ground conductor surface) of the printed wiring board 10, the conductor layer 23 (ground conductor surface) of the MMIC chip 20, and the coupling parts 30 that electrically couple the conductor layer 13 and the conductor layer 23. It is to be noted that the conductor layer 13 of the printed wiring board 10 is electrically coupled to the conductor layer 14 through the conductor parts 15 and the conductor layer 23 of the MMIC chip 20 is electrically coupled to the conductor layer 24 through the conductor parts 25. The conductor layer 14 and the conductor layer 24 are coupled by the coupling parts 30 (FIG. 3 and FIG. 4B). Furthermore, although dimensions are made slightly different between the conductor layer 14 of the printed wiring board 10 and the conductor layer 24 of the MMIC chip 20 in FIG. 6B for convenience, the dimensions of the conductor layer 14 and the conductor layer 24 may be set identical.

Signal transmission between the signal line 11 of the printed wiring board 10 and the signal line 21 of the MMIC chip 20, which are located separately in sectional view and plan view, is carried out through the waveguide 40 (rectangular waveguide). The waveguide 40 functions as a so-called post-wall waveguide having the coupling parts 30 as sidewalls (ground conductor walls).

Signal transduction (mode transduction) between the signal line 11 of the printed wiring board 10 and the waveguide 40 is carried out by a transducing part 50. In the exemplified transducing part 50, the conductor layer 13 (and the conductor layer 14 and the conductor parts 15), which is the ground conductor of the printed wiring board 10, the conductor layer 23 (and the conductor layer 24 and the conductor parts 25), which is the ground conductor of the MMIC chip 20, and the coupling parts 30 that electrically couple the conductor layer 13 and the conductor layer 23 are included. By the transducing part 50, mode transduction of a signal transmitted from the signal line 11 or to the signal line 11 is carried out. In the electronic device 1, a transduction structure between the signal line 11 of the microstripline and the rectangular waveguide is used to implement the mode transduction.

Signal transduction (mode transduction) between the signal line 21 of the MMIC chip 20 and the waveguide 40 is carried out by a transducing part 60. In the exemplified transducing part 60, the conductor layer 23 (and the conductor layer 24 and the conductor parts 25), which is the ground conductor of the MMIC chip 20, the conductor layer 13 (and the conductor layer 14 and the conductor parts 15), which is the ground conductor of the printed wiring board 10, and the coupling parts 30 that electrically couple the conductor layer 23 and the conductor layer 13 are included. By the transducing part 60, mode transduction of a signal transmitted to the signal line 21 or from the signal line 21 is carried out. In the electronic device 1, a transduction structure between the signal line 21 of the microstripline and the rectangular waveguide is used to implement the mode transduction.

For example, signal transmission from the signal line 11 of the printed wiring board 10 to the signal line 21 of the MMIC chip 20 is carried out as follows. First, the mode of a signal transmitted in the signal line 11 of the printed wiring board 10 (for example, quasi-transverse electromagnetic (TEM) mode) is transduced to the mode of the waveguide 40 (for example, $TE_{10}$ mode) by the transducing part 50. The signal whose mode has been transduced is transmitted in the waveguide 40. The signal transmitted in the waveguide 40 to be transmitted to the transducing part 60 is subjected to mode transduction (for example, quasi-TEM mode) by the transducing part 60 similarly to the transducing part 50 and then is transmitted to the signal line 21 of the MMIC chip 20.

Signal transmission from the signal line 21 of the MMIC chip 20 to the signal line 11 of the printed wiring board 10 is also similar. A signal transmitted in the signal line 21 is subjected to mode transduction by the transducing part 60 and is transmitted in the waveguide 40. Then, the signal is subjected to mode transduction by the transducing part 50 and is transmitted to the signal line 11.

In the electronic device 1, the signal transmission is carried out through the waveguide 40 including the ground conductors of the printed wiring board 10 (the conductor layers 13 and 14 and the conductor parts 15), the ground conductors of the MMIC chip 20 (the conductor layers 23 and 24 and the conductor parts 25), and the coupling parts 30 that electrically couple these ground conductors. The sidewalls of the waveguide 40 are formed by the coupling parts 30 that couple the printed wiring board 10 and the MMIC chip 20 electrically and mechanically. Even the discontinuous structure like these coupling parts 30 may be treated as the sidewalls of the waveguide 40.

In the electronic device 1, because the signal transmission between the signal line 11 of the printed wiring board 10 and the signal line 21 of the MMIC chip 20 is carried out through the waveguide 40 by utilizing mode transduction, physical direct coupling between the signal line 11 and the signal line 21 is unnecessary.

The dimensions of the coupling parts 30 that couple the printed wiring board 10 and the MMIC chip 20 electrically and mechanically may be set based on the dimensions of the waveguide 40, in which the signal transmission between the signal line 11 and the signal line 21 is carried out. The design of the dimensions of the waveguide 40 may be made approximate to a normal rectangular waveguide. The width may be set to approximately half of the wavelength and the height may be set to approximately a quarter of the wavelength. For example, the height of the coupling parts 30 may be set to approximately a quarter of the wavelength of the transmission signal.

According to the electronic device 1, signal transmission may be carried out even when the printed wiring board 10 and the MMIC chip 20 are coupled by the coupling parts 30 that are large compared with the case in which each other's signal lines 11 and 21 are directly coupled by bumps or the like.

It is to be noted that, in the above-described electronic device 1, the conductor layer 14 having a loop shape is provided in the printed wiring board 10 and the conductor layer 24 having a loop shape is provided in the MMIC chip 20. However, the conductor layer 14 and the conductor layer 24 do not necessarily need to be such a continuous conductor pattern.

Figure 7A:
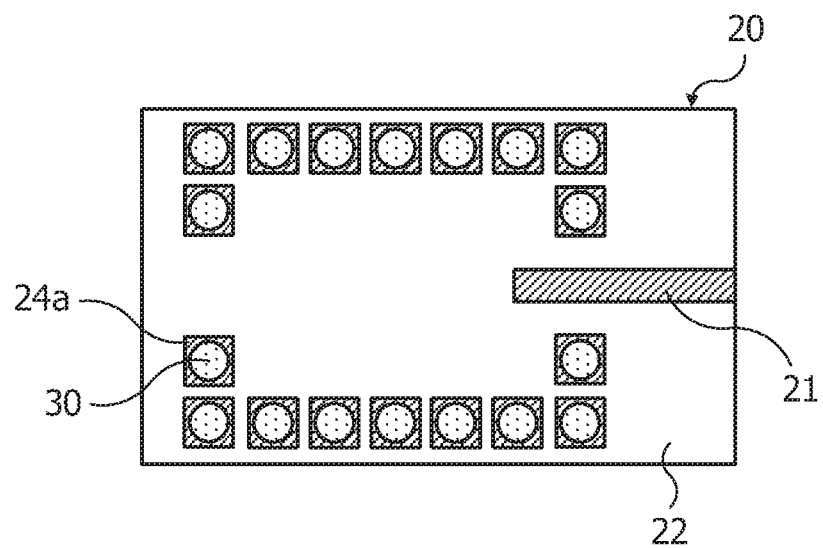
FIGS. 7A and 7B depict diagrams illustrating modification examples of an electronic device according to the first embodiment.
Figure 7B:
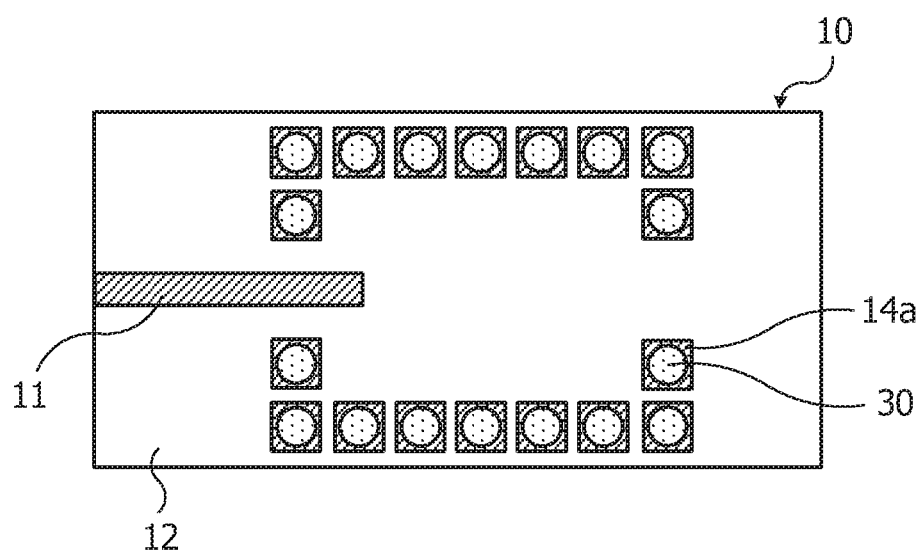

FIG. 7 depicts diagrams illustrating modification examples of an electronic device according to the first embodiment. FIG. 7A is a planar schematic diagram when a section along coupling parts is viewed toward the MMIC chip and FIG. 7B is a planar schematic diagram when the section along the coupling parts is viewed toward the printed wiring board.

The printed wiring board 10 may include conductor layers 14a each provided at a respective one of sites at which the coupling parts 30 are disposed as illustrated in FIG. 7B, for example. The conductor layers 14a are electrically coupled to the ground conductor or the ground conductors provided in the printed wiring board 10. For example, the conductor layers 14a are electrically coupled to the conductor layer 13.

The MMIC chip 20 may also include conductor layers 24a each provided at a respective one of sites at which the coupling parts 30 are disposed similarly as illustrated in FIG. 7A, for example. The conductor layers 24a are electrically coupled to the ground conductor or the ground conductors provided in the MMIC chip 20. For example, the conductor layers 24a are electrically coupled to the conductor layer 23.

As above, even when the conductor patterns to which the coupling parts 30 are coupled are the discontinuous conductor layers 14a and conductor layers 24a, the conductor layers 14a and 24a may be employed in the printed wiring board 10 and the MMIC chip 20 as long as the conductor layers 14a and 24a are set to the ground potential. Even when such conductor layers 14a and conductor layers 24a are used, the waveguide 40 that carries out signal transmission between the signal line 11 and the signal line 21 and the transducing part 50 and the transducing part 60 among the signal line 11 and the signal line 21 and the waveguide 40 are realized similarly to the description made with the above-described FIG. 6 and so forth.

Furthermore, in the above-described electronic device 1, the conductor layer 14 (or conductor layers 14a in the above-described FIG. 7B, similarly applies hereinafter) and the signal line 11 of the printed wiring board 10 may be covered by a protective film except for the places of the coupling of the conductor layer 14 with the coupling parts 30. Similarly, the conductor layer 24 (or conductor layers 24a in the above-described FIG. 7A, similarly applies hereinafter) and the signal line 21 of the MMIC chip 20 may be covered by a protective film except for the places of the coupling of the conductor layer 24 with the coupling parts 30. As the protective film, organic insulating materials such as epoxy and polyimide and inorganic insulating materials such as silicon oxide and silicon nitride may be used.

Moreover, in the above-described electronic device 1, the coupling part 30 of the sidewall of the waveguide 40 may employ various kinds of configurations.

Figure 8A:
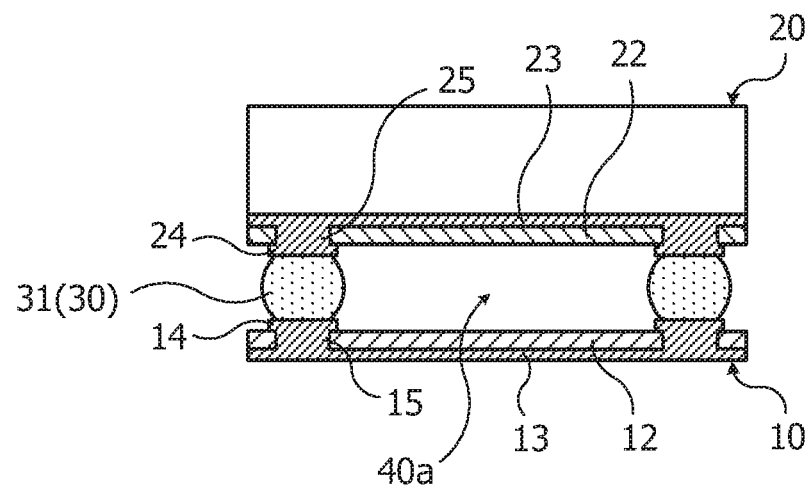
FIGS. 8A to 8C depict diagrams illustrating configuration examples of coupling parts of an electronic device according to the first embodiment.
Figure 8B:
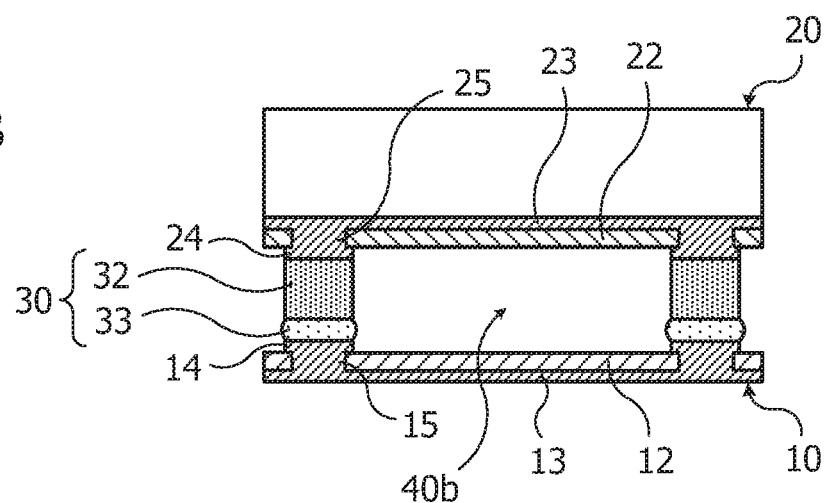
Figure 8C:
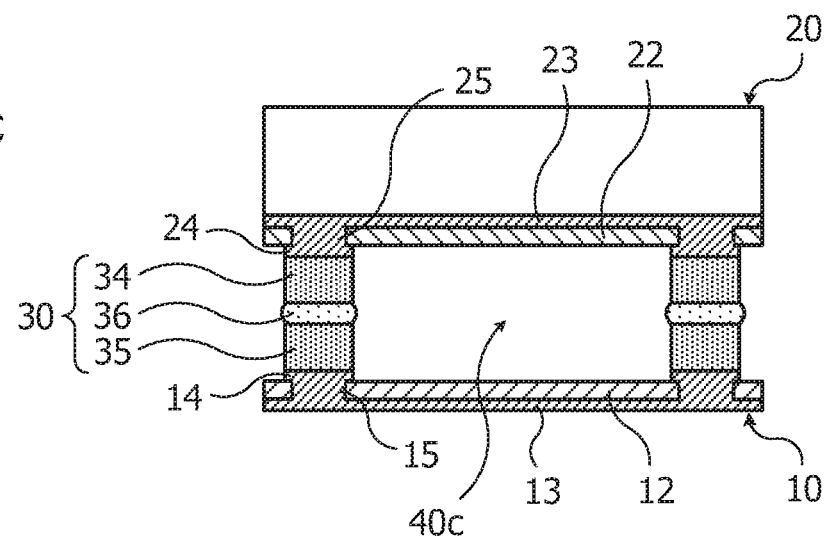

FIG. 8 depicts diagrams illustrating configuration examples of coupling parts of an electronic device according to the first embodiment. FIG. 8A to FIG. 8C are each a sectional schematic diagram of the major part of one example of the electronic device.

For the coupling parts 30 between the printed wiring board 10 and the MMIC chip 20 in the electronic device 1, solder bumps 31 illustrated in FIG. 8A may be used. The electronic device 1 in which such solder bumps 31 are used for the coupling parts 30 between the printed wiring board 10 and the MMIC chip 20 may be formed as follows, for example. First, solder bumps are formed in advance on the conductor layer 14 of the printed wiring board 10 or on the conductor layer 24 of the MMIC chip 20 or both on the conductor layer 14 and on the conductor layer 24. Then, at the time of mounting of the MMIC chip 20 on the printed wiring board 10, the solder bumps formed on one or both of the conductor layers 14 and 24 are coupled to the coupling counterpart (the conductor layer 24 or the conductor layer 14 or solder bumps on the counterpart side) by reflow. In this manner, the printed wiring board 10 and the MMIC chip 20 are coupled electrically and mechanically by using the solder bumps 31 as the coupling parts 30.

Besides, it is also possible to use posts like ones illustrated in FIG. 8B and FIG. 8C for the coupling parts 30 between the printed wiring board 10 and the MMIC chip 20. For the posts, various kinds of conductor materials, for example, copper may be used.

In the example of FIG. 8B, posts 32 provided on the conductor layer 24 of the MMIC chip 20 are coupled to the conductor layer 14 of the printed wiring board 10 with the intermediary of solders 33. The electronic device 1 in which such posts 32 and solders 33 are used for the coupling parts 30 is formed as follows, for example. First, the posts 32 are provided on the conductor layer 24 of the MMIC chip 20 and the solders 33 are provided on the posts 32 or on the conductor layer 14 of the printed wiring board 10. Then, at the time of mounting of the MMIC chip 20 on the printed wiring board 10, the posts 32 and the conductor layer 14 are coupled by the solders 33 by reflow. In this manner, the printed wiring board 10 and the MMIC chip 20 are coupled electrically and mechanically by using the posts 32 and the solders 33 as the coupling parts 30.

In the example of FIG. 8C, posts 34 provided on the conductor layer 24 of the MMIC chip 20 are coupled to posts 35 provided on the conductor layer 14 of the printed wiring board 10 with the intermediary of solders 36. The electronic device 1 in which such posts 34, solders 36, and posts 35 are used for the coupling parts 30 is formed as follows, for example. First, the posts 34 and the posts 35 are provided on the conductor layer 24 of the MMIC chip 20 and on the conductor layer 14 of the printed wiring board 10, respectively, and the solders 36 are provided on either one or both of the posts 34 and 35. Then, at the time of mounting of the MMIC chip 20 on the printed wiring board 10, the posts 34 and the posts 35 are coupled by the solders 36 by reflow. In this manner, the printed wiring board 10 and the MMIC chip 20 are coupled electrically and mechanically by using the posts 34, the solders 36, and the posts 35 as the coupling parts 30.

By individually coupling the printed wiring board 10 and the MMIC chip 20 by the coupling parts 30 illustrated in FIG. 8A to FIG. 8C, a waveguide 40a, a waveguide 40b, and a waveguide 40c having the coupling parts 30 as sidewalls are realized. Signal transmission is carried out between the signal line 11 and the signal line 21 that are separate like those illustrated in the above-described FIG. 6 and so forth through these waveguide 40a, waveguide 40b, and waveguide 40c similarly to the above-described waveguide 40 and so forth.

Next, a description will be made with reference to FIG. 9 and FIG. 10 regarding electromagnetic field analysis carried out about the waveguide 40 of the above-described electronic device 1.

Figure 9:
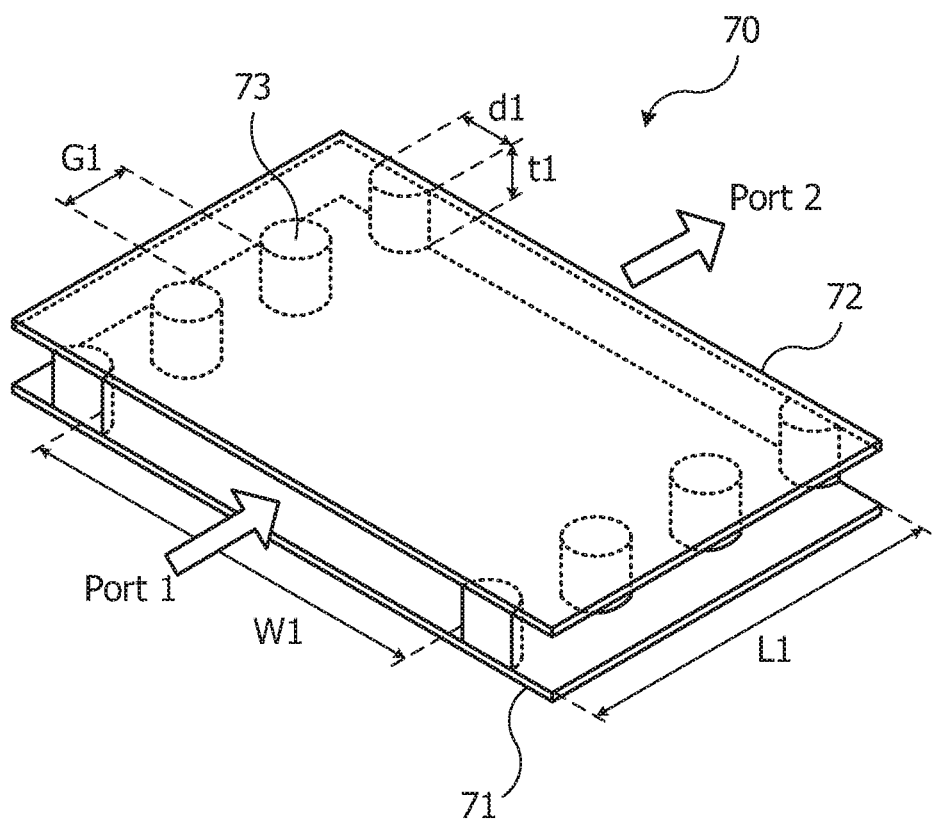
FIG. 9 depicts a diagram illustrating one example of a model of electromagnetic field analysis of a waveguide according to the first embodiment.

FIG. 9 depicts a diagram illustrating one example of a model of electromagnetic field analysis of a waveguide according to the first embodiment. FIG. 10 depicts a diagram illustrating one example of a result of electromagnetic field analysis of a waveguide according to the first embodiment.

For the electromagnetic field analysis, a model 70 illustrated in FIG. 9 is used. In the model 70, a structure in which a ground conductor surface 71 and a ground conductor surface 72 that are opposed to each other are coupled by coupling parts 73 of solder is employed and design in which a signal of a milliwave of 77 GHz is transmitted is employed. Diameter d1 of each coupling part 73 is set to 0.3 mm and height t1 is set to 0.3 mm. By the opposed ground conductor surface 71 and ground conductor surface 72 and the coupling parts 73 of solder, a waveguide in which width W1 is 2.2 mm and length L1 is 2 mm and the cutoff frequency is 70 GHz is formed.

Interval G1 of the coupling parts 73 in the waveguide length direction in such a model 70 was employed as a parameter and electromagnetic field analysis was carried out regarding input and output ports (Ports 1 and 2), so that the relationship between the interval G1 and an S-parameter has been obtained. The result of the electromagnetic field analysis is exemplified in FIG. 10. In FIG. 10, the relationship between the interval in wavelength terms (G1 [/wavelength]) and the pass characteristic of the transmission signal (|S21|[dB/mm]) is exemplified. Here, |S21|, which is one of the S-parameters, is used for evaluation of the insertion loss. As illustrated in FIG. 10, in the model 70, when the interval G1 is roughly equal to or shorter than 0.1 wavelength, the insertion loss per 1 mm is equal to or lower than 0.25 dB. When the interval G1 surpasses 0.1 wavelength, the insertion loss increases.

Figure 10:
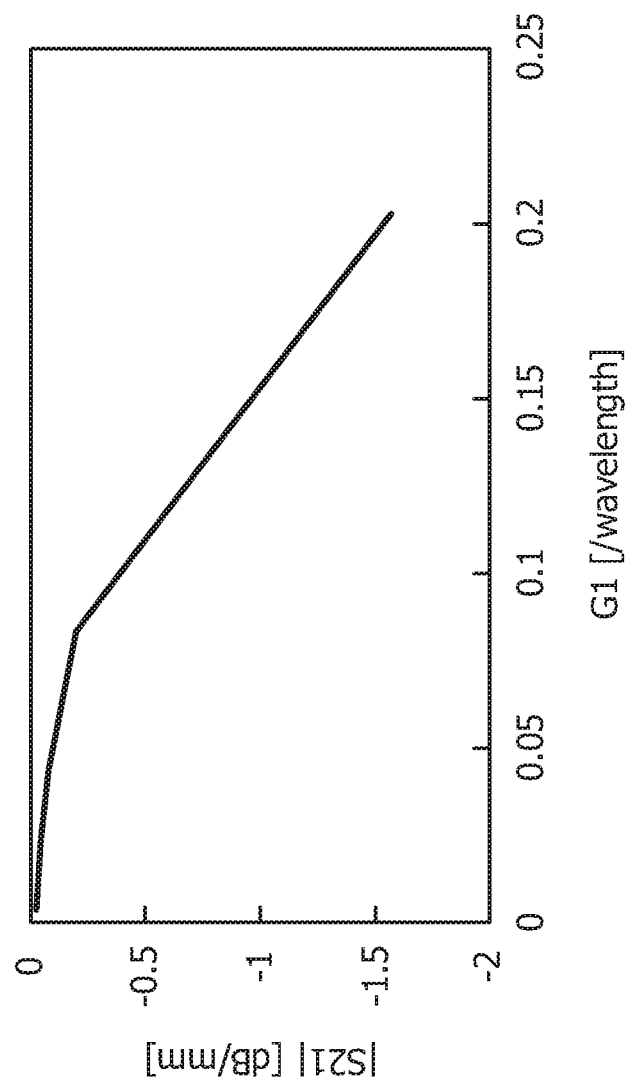
FIG. 10 depicts a diagram illustrating one example of a result of electromagnetic field analysis of a waveguide according to the first embodiment.

From the result of FIG. 10, it is preferable that the interval of the coupling parts 30 be set equal to or shorter than 0.1 wavelength in the waveguide 40 of the electronic device 1. However, the wavelength described here refers to the guide wavelength in the waveguide 40 and therefore is longer as the wavelength in free space.

As described above, in the electronic device 1 according to the first embodiment, the waveguide 40 and so forth are formed by using the coupling parts 30 that couple the printed wiring board 10 and the MMIC chip 20 electrically and mechanically, and signal transmission between the signal line 11 and the signal line 21 that are separate is carried out by using the waveguide 40. According to the electronic device 1, with suppression of miniaturization of the coupling parts 30 between the printed wiring board 10 and the MMIC chip 20, signal transmission with low loss between the signal line 11 and the signal line 21 that are not directly coupled physically may be realized. This may avoid increase in the mounting cost, which is possibly caused when the signal line 11 and the signal line 21 are directly coupled by bumps, and variation in signal transmission characteristics due to a coupling reinforcing member.

Next, a second embodiment will be described.

In the above-described first embodiment, the ground conductors of the printed wiring board 10 (the conductor layers 13 and 14 and the conductor parts 15) and the ground conductors of the MMIC chip 20 (the conductor layers 23 and 24 and the conductor parts 25) are coupled electrically and mechanically by the coupling parts 30 discontinuously disposed. Besides, the ground conductors of the printed wiring board 10 and the MMIC chip 20 may be coupled electrically and mechanically by a pair of continuous conductor walls.

Figure 11:
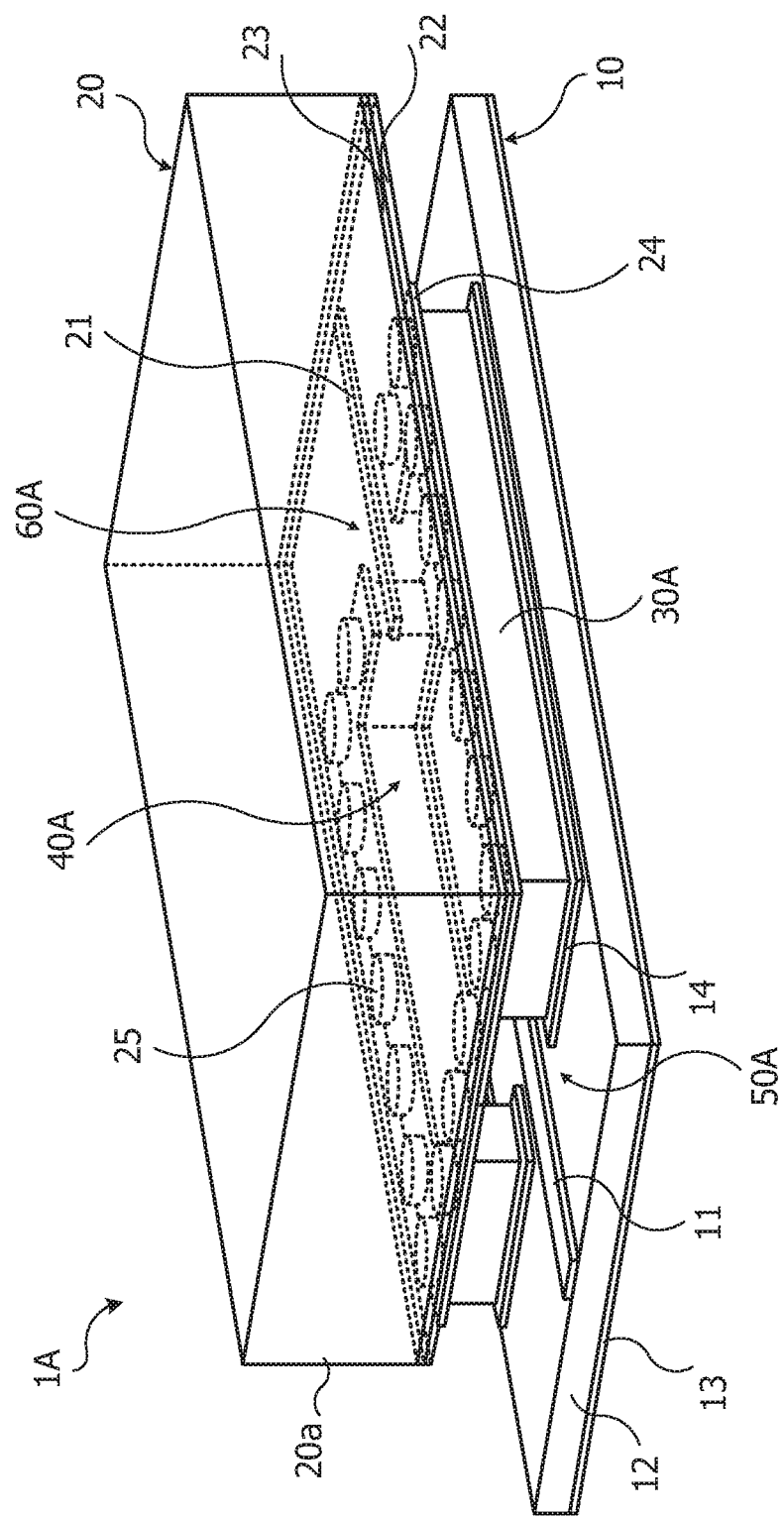
FIG. 11 depicts a diagram illustrating one example of an electronic device according to a second embodiment.

FIG. 11 depicts a diagram illustrating one example of an electronic device according to a second embodiment. FIG. 11 is a perspective schematic diagram of the major part of the one example of the electronic device according to the second embodiment.

An electronic device 1A illustrated in FIG. 11 has a configuration in which a conductor layer 14 of a printed wiring board 10 and a conductor layer 24 of an MMIC chip 20 are coupled electrically and mechanically by a pair of continuous conductor walls 30A. As above, in the electronic device 1A, the printed wiring board 10 and the MMIC chip 20 are coupled electrically and mechanically, with the conductor walls 30A being coupling parts. The electronic device 1A is different from the electronic device 1 described in the above first embodiment in this point.

It is to be noted that the conductor layer 14 of the printed wiring board 10 is electrically coupled to a conductor layer 13 through conductor parts 15 and the conductor layers 13 and 14 are both ground conductors whose potential becomes the ground potential when the electronic device 1A operates. The conductor layer 24 of the MMIC chip 20 is electrically coupled to a conductor layer 23 through conductor parts 25 and the conductor layers 23 and 24 are both ground conductors whose potential becomes the ground potential when the electronic device 1A operates. The potential of the conductor walls 30A electrically coupled to the conductor layer 14 of the printed wiring board 10 and the conductor layer 24 of the MMIC chip 20 also becomes the ground potential when the electronic device 1A operates (ground conductor walls).

For the respective conductor walls 30A of the electronic device 1A, various kinds of conductor materials such as solder and copper may be used.

For example, the conductor walls 30A using solder are obtained by causing solder formed into a wall shape in advance to intervene between the conductor layer 14 and the conductor layer 24 and reflowing the solder at the time of mounting of the MMIC chip 20 on the printed wiring board 10.

Furthermore, the conductor walls 30A using copper are obtained by causing copper that is formed into a wall shape in advance and has solder provided on the upper and lower surfaces of the copper to intervene between the conductor layer 14 and the conductor layer 24 and reflowing the solder at the time of mounting of the MMIC chip 20 on the printed wiring board 10, for example.

Alternatively, it is also possible to obtain the conductor walls 30A using copper in accordance with the example of the above-described FIG. 8B or FIG. 8C. For example, wall-shaped posts are formed in advance on the conductor layer 14 of the printed wiring board 10 or on the conductor layer 24 of the MMIC chip 20 or both on the conductor layer 14 and on the conductor layer 24. Then, by reflow at the time of mounting of the MMIC chip 20 on the printed wiring board 10, the posts formed on one or both of the conductor layers 14 and 24 are coupled to the coupling counterpart (the conductor layer 24 or the conductor layer 14 or posts on the counterpart side) by solder. The conductor walls 30A may be obtained in this manner.

In the electronic device 1A, a waveguide 40A, a transducing part 50A, and a transducing part 60A are formed by the ground conductors such as the conductor layer 13 on the side of the printed wiring board 10, the ground conductors such as the conductor layer 23 on the side of the MMIC chip 20, and the pair of conductor walls 30A that electrically couple these ground conductors. Signal transmission between the signal line 11 of the printed wiring board 10 and the signal line 21 of the MMIC chip 20 is carried out through the waveguide 40A. For example, a signal transmitted in the signal line 11 of the printed wiring board 10 is subjected to mode transduction by the transducing part 50A and is transmitted in the waveguide 40A. Then, the signal is subjected to mode transduction by the transducing part 60A and is transmitted to the signal line 21 of the MMIC chip 20. Alternatively, a signal transmitted in the signal line 21 of the MMIC chip 20 is subjected to mode transduction by the transducing part 60A and is transmitted in the waveguide 40A. Then, the signal is subjected to mode transduction by the transducing part 50A and is transmitted to the signal line 11 of the printed wiring board 10.

Also by the electronic device 1A using such conductor walls 30A, with suppression of miniaturization of the conductor walls 30A serving as the coupling parts between the printed wiring board 10 and the MMIC chip 20, signal transmission with low loss between the signal line 11 and the signal line 21 that are not directly coupled physically may be realized.

In the electronic device 1A, the conductor layer 14 and the signal line 11 of the printed wiring board 10 and the conductor layer 24 and the signal line 21 of the MMIC chip 20 may be covered by a protective film except for the places of the coupling of the conductor layers 14 and 24 with the conductor walls 30A.

Next, a third embodiment will be described.

Also here, an electronic device including a printed wiring board and an MMIC chip is employed as an example as with the above-described first embodiment.

Figure 12:
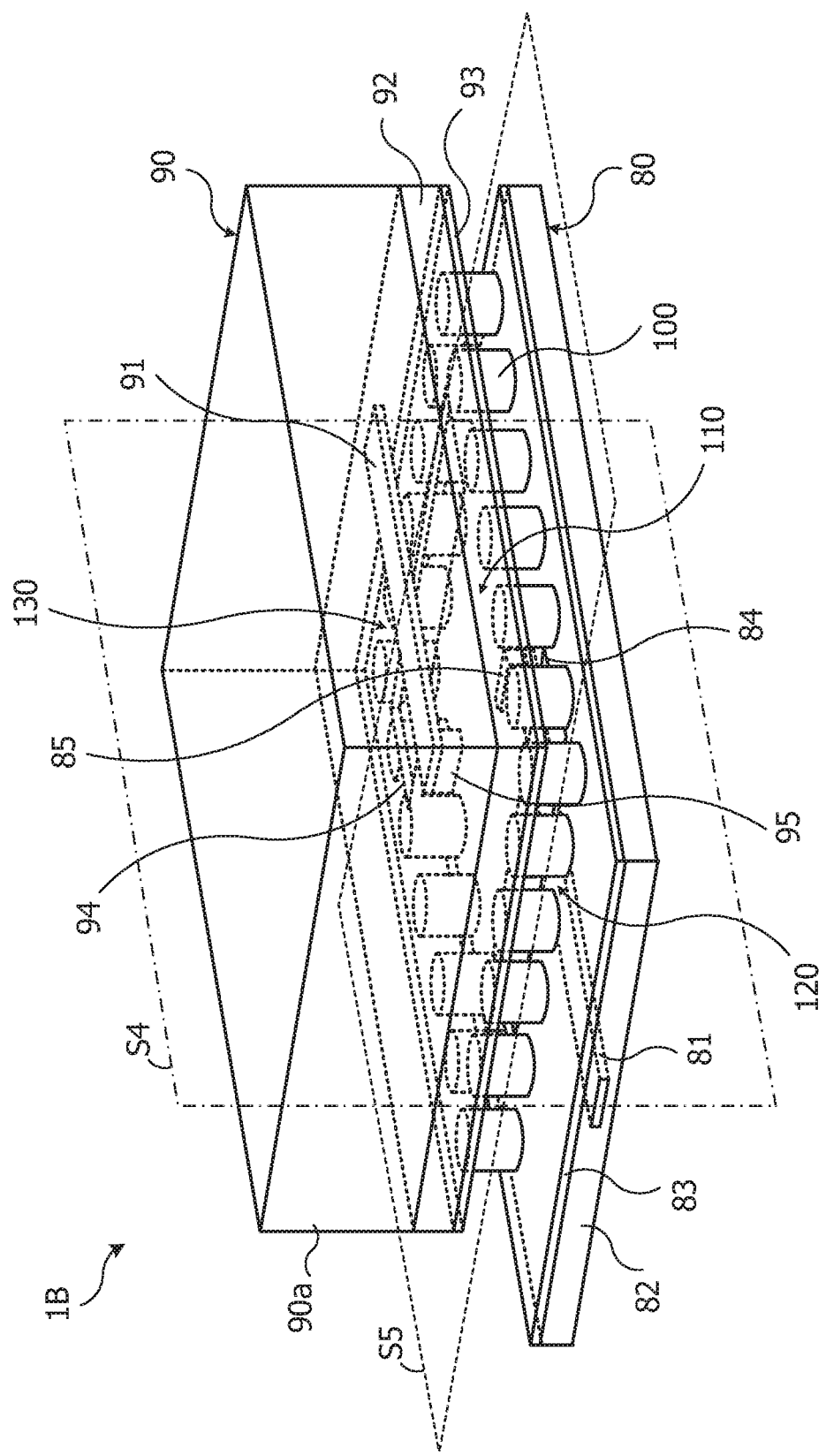
FIG. 12 depicts a diagram (first diagram) illustrating one example of an electronic device according to a third embodiment.
Figure 13:
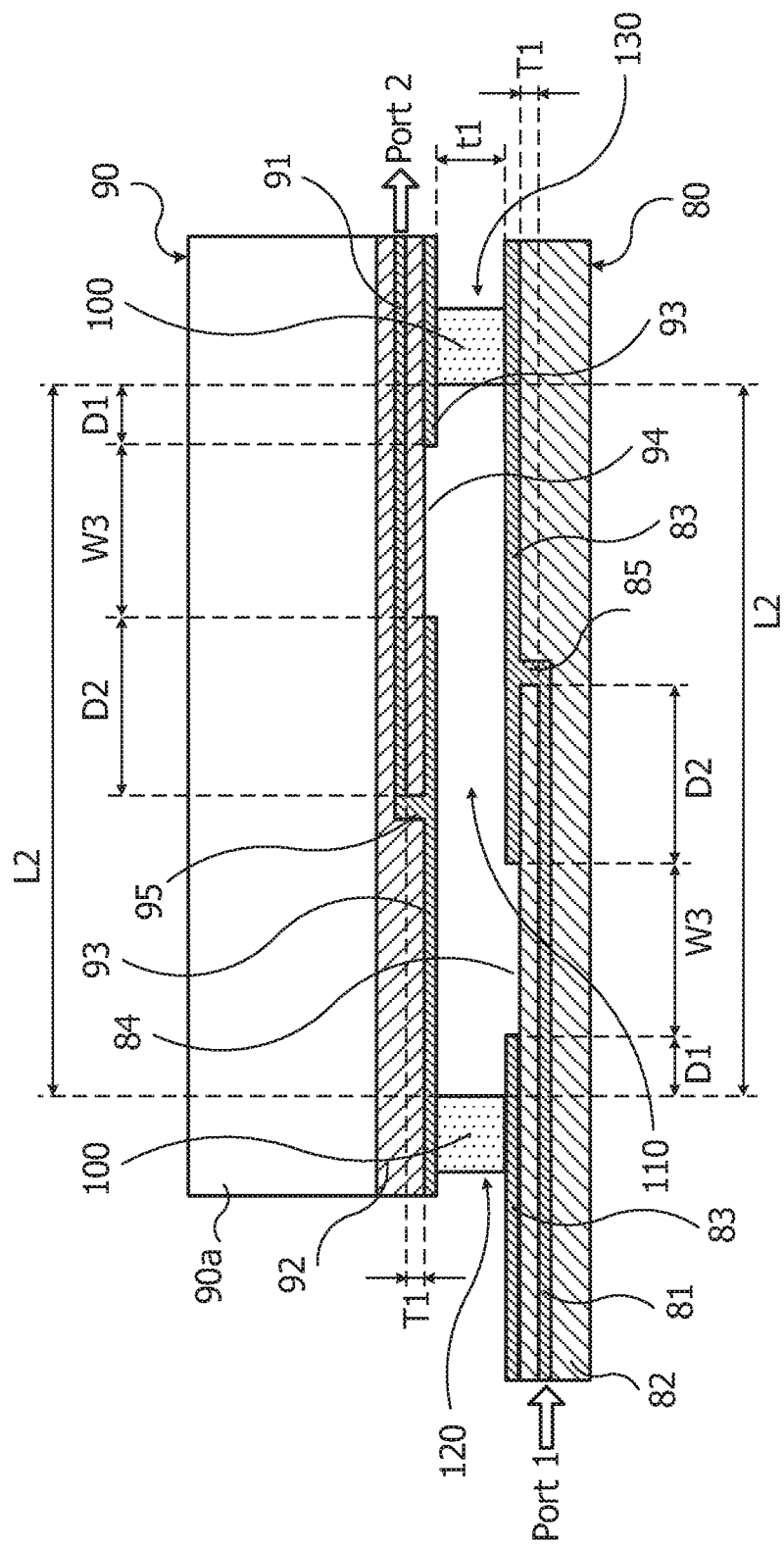
FIG. 13 depicts a diagram (second diagram) illustrating one example of an electronic device according to the third embodiment.
Figure 14A:
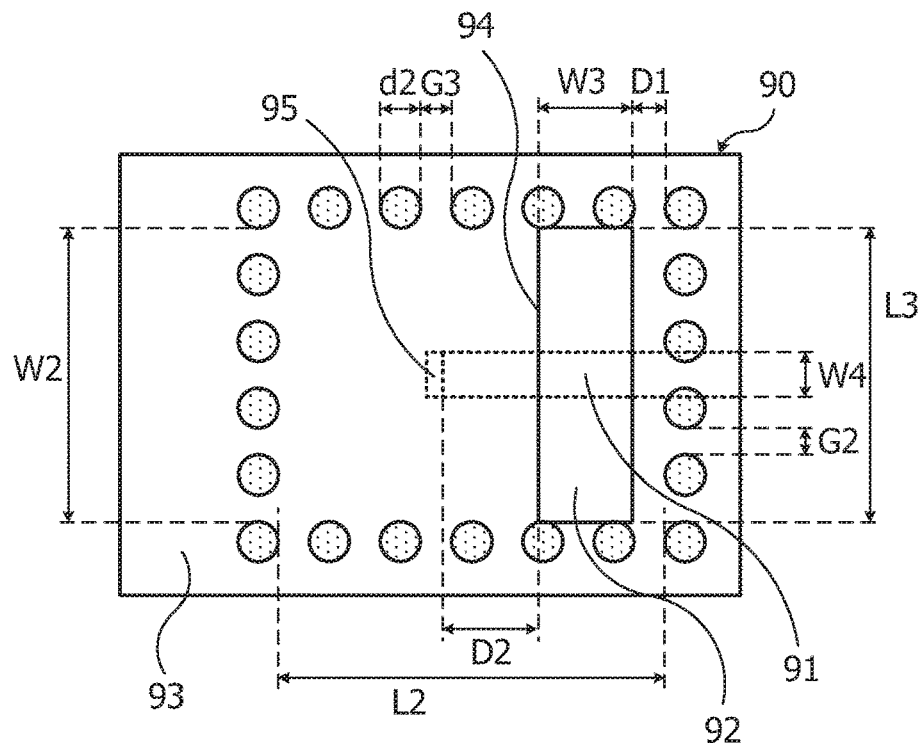
FIGS. 14A and 14B depict diagrams (third diagrams) illustrating examples of an electronic device according to the third embodiment.
Figure 14B:
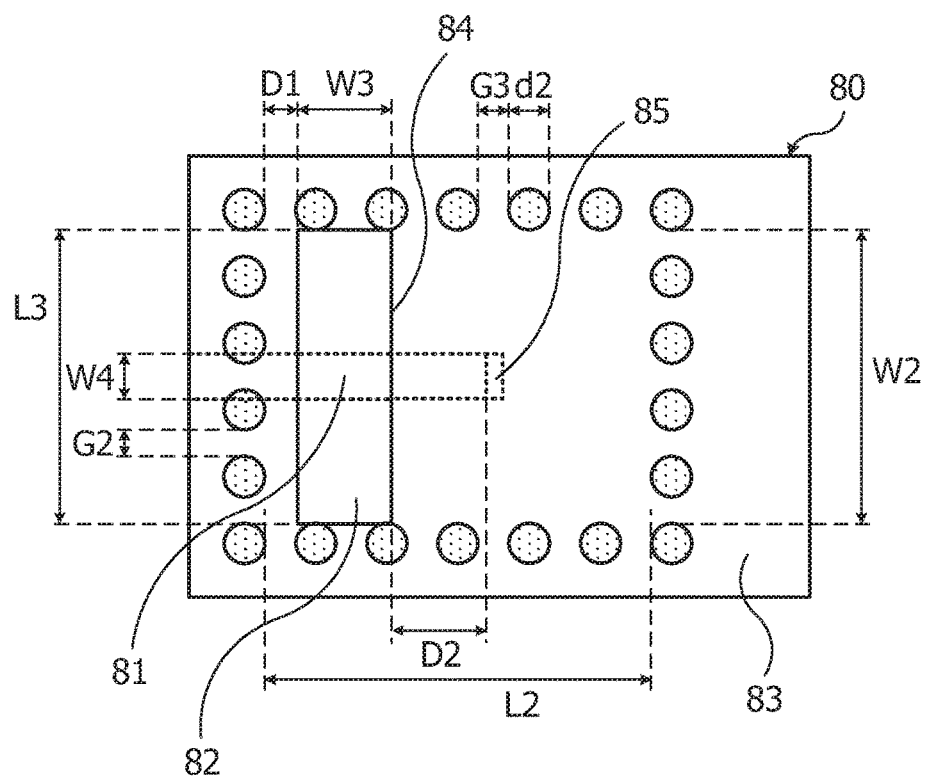

FIG. 12 to FIG. 14 are diagrams illustrating examples of an electronic device according to the third embodiment. FIG. 12 is a perspective schematic diagram of the major part of the one example of the electronic device according to the third embodiment. FIG. 13 is a sectional schematic diagram along a plane S4 in FIG. 12. FIG. 14A is a planar schematic diagram when a section along a plane S5 in FIG. 12 is viewed toward the MMIC chip and FIG. 14B is a planar schematic diagram when the section along the plane S4 in FIG. 12 is viewed toward the printed wiring board.

As illustrated in FIG. 12, an electronic device 1B includes a printed wiring board 80 and an MMIC chip 90.

The printed wiring board 80 includes a signal line 81, a dielectric layer 82, and a conductor layer 83 as illustrated in FIG. 12 to FIG. 14. The conductor layer 83 is provided as a superficial layer on the surface side coupled to the MMIC chip 90 with the intermediary of part of the dielectric layer 82 and the signal line 81 is provided opposed to the conductor layer 83 and inner layer of the printed wiring board 80. The conductor layer 83 includes an opening part 84 (slit). The signal line 81 is disposed to traverse the opening part 84 in plan view or sectional view and is short-circuited to the conductor layer 83 through coupling of the tip part to the conductor layer 83 by a conductor part 85 such as a via. The conductor layer 83 is a conductor layer whose potential becomes the ground potential when the electronic device 1B operates (ground conductor surface). The signal line 81 is a signal line with which signal transmission is carried out with a signal line 91 of the MMIC chip 90 to be described later. The transmission line of the signal of the printed wiring board 80 is a microstripline. Various kinds of insulating materials may be used for the dielectric layer 82. Various kinds of conductor materials such as copper may be used for the conductor layer 83, the signal line 81, and the conductor part 85.

The printed wiring board 80 includes the above-described structure illustrated in FIG. 12 to FIG. 14 at least in a superficial part on the surface side coupled to the MMIC chip 90.

The MMIC chip 90 mounted on the printed wiring board 80 includes the signal line 91, a dielectric layer 92, and a conductor layer 93 as illustrated in FIG. 12 to FIG. 14. The conductor layer 93 is provided as a superficial layer on the surface side coupled to the printed wiring board 80 with the intermediary of part of the dielectric layer 92 and the signal line 91 is provided opposed to the conductor layer 93 and inner layer of the MMIC chip 90. The conductor layer 93 includes an opening part 94 (slit). The signal line 91 is disposed to traverse the opening part 94 in plan view or sectional view and is short-circuited to the conductor layer 93 through coupling of the tip part to the conductor layer 93 by a conductor part 95 such as a via. The conductor layer 93 is a conductor layer whose potential becomes the ground potential when the electronic device 1B operates (ground conductor surface). The signal line 91 is a signal line with which signal transmission is carried out with the signal line 81 of the above-described printed wiring board 80. The transmission line of the signal of the MMIC chip 90 is a microstripline. Various kinds of insulating materials may be used for the dielectric layer 92. Various kinds of conductor materials such as copper may be used for the conductor layer 93, the signal line 91, and the conductor part 95.

The MMIC chip 90 includes the structure including the above-described signal line 91, dielectric layer 92, conductor layer 93, and conductor part 95 in a superficial part on the surface side coupled to the printed wiring board 80, for example, in a wiring layer on a main body part 90a in which various kinds of circuit elements of transistors and the like are formed or part of the wiring layer.

The conductor layer 83 of the printed wiring board 80 and the conductor layer 93 of the MMIC chip 90 are coupled with the intermediary of plural coupling parts 100. For the coupling parts 100, for example, solder bumps and posts may be used as with the coupling parts 30 (FIG. 8) described in the above first embodiment. In the electronic device 1B, the ground conductors of the printed wiring board 80 and the MMIC chip 90 are electrically coupled by the coupling parts 100. In addition, the printed wiring board 80 and the MMIC chip 90 are mechanically coupled by the coupling parts 100. Also in the electronic device 1B, the signal line 81 of the printed wiring board 80 and the signal line 91 of the MMIC chip 90 are not directly coupled physically.

In the electronic device 1B, a waveguide 110 is formed by the conductor layer 83 of the printed wiring board 80, the conductor layer 93 of the MMIC chip 90, and the coupling parts 100 that couple the conductor layers 83 and 93. Signal transmission between the signal line 81 of the printed wiring board 80 and the signal line 91 of the MMIC chip 90, which are not directly coupled physically, is carried out through the waveguide 110.

Mode transduction between the signal line 81 of the printed wiring board 80 and the waveguide 110 is carried out by a transducing part 120. In the transducing part 120, the conductor layer 83 (part in which the opening part 84 is included) of the printed wiring board 80 and the conductor layer 93 (part in which the opening part 94 is not included) of the MMIC chip 90 are included. In the transducing part 120, mode transduction of a signal transmitted from the signal line 81 or to the signal line 81 through the opening part 84 of the conductor layer 83 is carried out.

Mode transduction between the signal line 91 of the MMIC chip 90 and the waveguide 110 is carried out by a transducing part 130. In the transducing part 130, the conductor layer 93 (part in which the opening part 94 is included) of the MMIC chip 90 and the conductor layer 83 (part in which the opening part 84 is not included) of the printed wiring board 80 are included. In the transducing part 130, mode transduction of a signal transmitted to the signal line 91 or from the signal line 91 through the opening part 94 of the conductor layer 93 is carried out.

For example, a signal transmitted in the signal line 81 of the printed wiring board 80 is subjected to mode transduction by the transducing part 120 and is transmitted in the waveguide 110. Then, the signal is subjected to mode transduction by the transducing part 130 and is transmitted to the signal line 91 of the MMIC chip 90. Alternatively, a signal transmitted in the signal line 91 of the MMIC chip 90 is subjected to mode transduction by the transducing part 130 and is transmitted in the waveguide 110. Then, the signal is subjected to mode transduction by the transducing part 120 and is transmitted to the signal line 81 of the printed wiring board 80.

As one example of the above-described electronic device 1B, an electronic device used in a milliwave band centered at 77 GHz will be described. Here, for simplification, an example will be represented in which microstriplines of the same dimensions and material are provided on the side of the printed wiring board 80 and on the side of the MMIC chip 90. The microstriplines are designed to have characteristic impedance of 50 Ω.

The conductor layer 83 as the ground conductor of the printed wiring board 80 is electrically and mechanically coupled to the conductor layer 93 as the ground conductor of the MMIC chip 90 by twenty two coupling parts 100 disposed to surround a region having width W2 of 2.2 mm and length L2 of 2.9 mm. Diameter d2 of each coupling part 100 is set to 0.3 mm and height t1 is set to 0.3 mm. Interval G2 between the coupling parts 100 adjacent in the width direction is set to 0.2 mm and interval G3 between the coupling parts 100 adjacent in the length direction is set to 0.23 mm. The waveguide 110 having width W2 of 2.2 mm and a cutoff frequency of 70 GHz is formed by the conductor layer 83, the conductor layer 93, and the coupling parts 100. In the conductor layer 83 of the printed wiring board 80, the opening part 84 having width W3 of 0.7 mm and length L3 of 2.2 mm is made at a position at which distance D1 from the coupling parts 100 lined up in the width direction is 0.25 mm in order to couple the signal line 81 and the waveguide 110. Width W4 of the signal line 81 is set to 0.325 mm and the signal line 81 is short-circuited to the conductor layer 83 by the conductor part 85 at a position at which distance D2 from the opening part 84 is 0.725 mm. The signal line 81 and the conductor layer 83 are provided with the intermediary of a dielectric layer (part of the dielectric layer 82) having thickness T1 of 0.1 mm.

The MMIC chip 90 has a structure similar to that of the printed wiring board 80 in a superficial part on the surface side coupled to the printed wiring board 80. For example, the conductor layer 93 of the MMIC chip 90 is electrically and mechanically coupled to the conductor layer 83 of the printed wiring board 80 by the coupling parts 100 that have the diameter d2 and the height t1 and are disposed at the intervals G2 and G3 to surround the region having the width W2 and the length L2. In the conductor layer 93 of the MMIC chip 90, the opening part 94 having the width W3 and the length L3 is provided at a position at the distance D1 from the coupling parts 100 lined up in the width direction in order to couple the signal line 91 and the waveguide 110. At a position at the distance D2 from the opening part 94, the signal line 91 having the width W4 is short-circuited to the conductor layer 93 by the conductor part 95. The signal line 91 and the conductor layer 93 are provided with the intermediary of a dielectric layer (part of the dielectric layer 92) having the thickness T1.

Solder bumps are used for the coupling parts 100. Copper is used for the signal lines 81 and 91, the conductor layers 83 and 93, and the conductor parts 85 and 95. An epoxy material having relative permittivity of 4.4 is used for the dielectric layers 82 and 92.

A description will be made with reference to FIG. 15 regarding electromagnetic field analysis carried out about the electronic device 1B having such a configuration.

Figure 15:
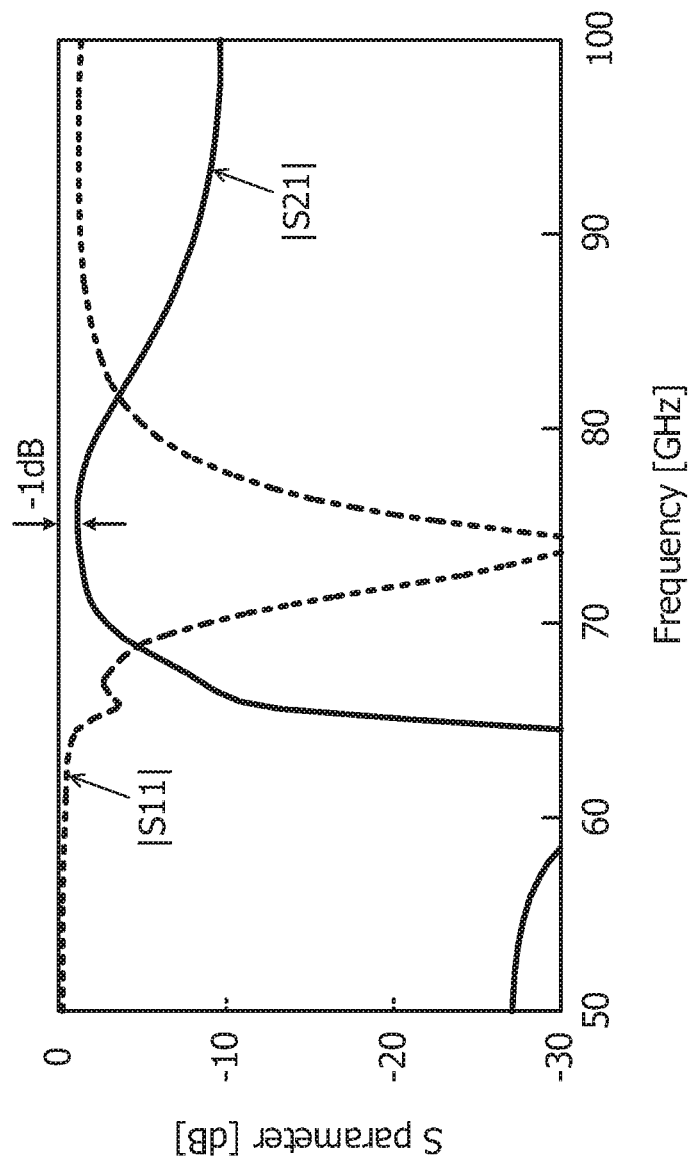
FIG. 15 depicts a diagram illustrating one example of a result of electromagnetic field analysis of an electronic device according to the third embodiment.

FIG. 15 depicts a diagram illustrating one example of a result of electromagnetic field analysis of an electronic device according to the third embodiment.

In FIG. 15, one example of the relationship between the frequency (Frequency [GHz]) and S-parameters (S parameter [dB]) obtained by the electromagnetic field analysis of signal transmission from the signal line 81 (Port 1; FIG. 13) to the signal line 91 (Port 2; FIG. 13) is illustrated. Here, |S11| is used for evaluation of the reflection characteristic and |S21| is used for evaluation of the pass characteristic.

According to the electronic device 1B having the above-described configuration, insertion loss of −1 dB is realized at 77 GHz. According to the electronic device 1B having the above-described configuration, the band that may be used depends on the band of the transducing part 120 and the transducing part 130 and the band is narrow in the case of the transduction structure utilizing resonance. According to the example of the electronic device 1B having the above-described configuration, the 3-dB pass-band is approximately 10 GHz.

As described above, in the electronic device 1B according to the third embodiment, the waveguide 110 is formed by using the coupling parts 100 that couple the printed wiring board 80 and the MMIC chip 90 electrically and mechanically, and signal transmission between the signal line 81 and the signal line 91 that are separate is carried out by using the waveguide 100. According to the electronic device 1B, with suppression of miniaturization of the coupling parts 100 between the printed wiring board 80 and the MMIC chip 90, signal transmission with low loss between the signal line 81 and the signal line 91 that are not directly coupled physically may be realized.

It is to be noted that, in the electronic device 1B, the conductor layer 83 of the printed wiring board 80 and the conductor layer 93 of the MMIC chip 90 may be covered by a protective film except for the places of the coupling with the coupling parts 100.

Furthermore, in the electronic device 1B, in accordance with the example of the conductor walls 30A described in the above second embodiment, conductor walls that couple the conductor layer 83 and the conductor layer 93 electrically and mechanically and surround a given region may be provided instead of the coupling parts 100.

The first to third embodiments are described above. In the above description, the microstripline is employed as the configuration of the transmission line of a signal. However, the configuration of the transmission line is not limited to this example.

FIG. 16 depicts diagrams illustrating configuration examples of transmission lines of a signal.

Figure 16A:
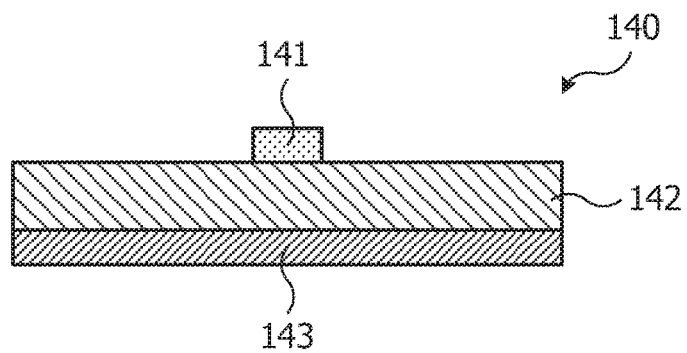
FIGS. 16A to 16C depict diagrams illustrating configuration examples of transmission lines of a signal.

In FIG. 16A, a section of the major part of a microstripline 140 in which a conductor layer 143 of a ground conductor is provided on one surface of a dielectric layer 142 and a signal line 141 is provided on the other surface is schematically represented. As described above, the microstripline 140 illustrated in FIG. 16A may be employed for the signal line 11 of the printed wiring board 10, the signal line 81 of the printed wiring board 80, the signal line 21 of the MMIC chip 20, and the signal line 91 of the MMIC chip 90.

Figure 16B:
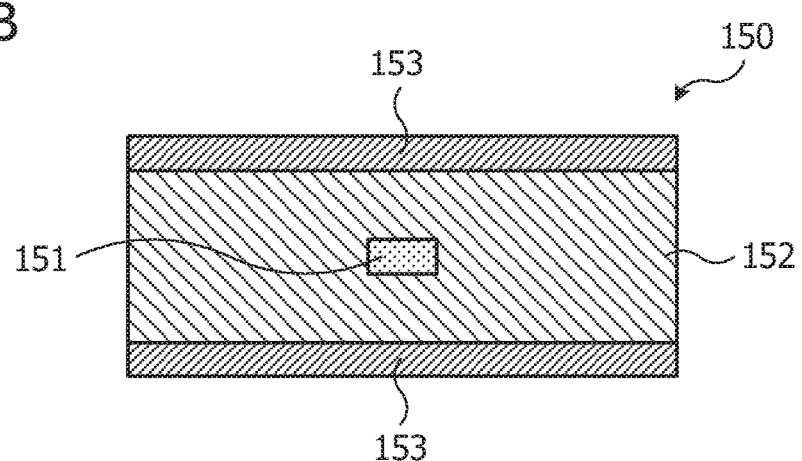
Figure 16C:
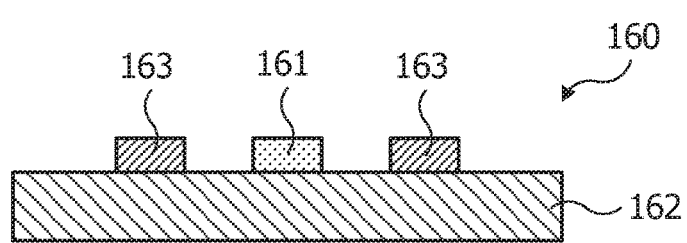

In FIG. 16B, a section of the major part of a stripline 150 in which a conductor layer 153 of a ground conductor is provided on both surfaces of a dielectric layer 152 and a signal line 151 is provided in the dielectric layer 152 is schematically represented. Furthermore, in FIG. 16C, a section of the major part of a coplanar line 160 in which conductor layers 163 of a ground conductor and a signal line 161 are provided on one surface of a dielectric layer 162 is schematically represented. The stripline 150 illustrated in FIG. 16B or the coplanar line 160 illustrated in FIG. 16C may be employed for the signal line 11 of the printed wiring board 10, the signal line 81 of the printed wiring board 80, the signal line 21 of the MMIC chip 20, and the signal line 91 of the MMIC chip 90.

In the printed wiring board 10 and the MMIC chip 20 or in the printed wiring board 80 and the MMIC chip 90, different kinds of transmission lines may be provided besides the same kind of transmission line.

Furthermore, although coupling between the printed wiring board 10 and the MMIC chip 20 and coupling between the printed wiring board 80 and the MMIC chip 90 are taken as examples in the above description, the above-described techniques may be similarly employed for coupling of various kinds of electronic components.

FIG. 17 depicts a diagram illustrating a configuration example of an electronic device.

In FIG. 17, a section of the major part of an electronic device 200 including an electronic component 180 and an electronic component 190 that are coupled by coupling parts 170 is schematically represented. The coupling parts 170 are electrically coupled to a ground conductor 183 (GND) provided in the electronic component 180 and a ground conductor 193 (GND) provided in the electronic component 190. A ground conductor surface provided at a corresponding position is included in each of the ground conductor 183 of the electronic component 180 and the ground conductor 193 of the electronic component 190. A waveguide 210, a transducing part 220, and a transducing part 230 are formed by the ground conductor 183 of the electronic component 180, the ground conductor 193 of the electronic component 190, and the coupling parts 170 that couple the ground conductors 183 and 193.

It is to be noted that, although detailed diagrammatic representation is omitted here, for example, structures like the waveguide 40, the transducing part 50, and the transducing part 60 described in the above first embodiment may be employed for the waveguide 210, the transducing part 220, and the transducing part 230. Besides, the conductor walls 30A described in the above second embodiment may be employed instead of the coupling parts 170 and structures like the waveguide 40A, the transducing part 50A, and the transducing part 60A may be employed. Alternatively, it is also possible to employ structures like the waveguide 110, the transducing part 120, and the transducing part 130 described in the above third embodiment.

A signal line 181 (SIG) of the electronic component 180 and a signal line 191 (SIG) of the electronic component 190 are not directly coupled physically. Signal transmission between the signal line 181 and the signal line 191 is carried out through the waveguide 210.

For example, a signal transmitted in the signal line 181 of the electronic component 180 is subjected to mode transduction by the transducing part 220 and is transmitted in the waveguide 210. Then, the signal is subjected to mode transduction by the transducing part 230 and is transmitted to the signal line 191 of the electronic component 190. Alternatively, a signal transmitted in the signal line 191 of the electronic component 190 is subjected to mode transduction by the transducing part 230 and is transmitted in the waveguide 210. Then, the signal is subjected to mode transduction by the transducing part 220 and is transmitted to the signal line 181 of the electronic component 180.

Various kinds of electronic components are used as the electronic component 180 of the electronic device 200. As the various kinds of electronic components, a semiconductor device such as a semiconductor chip or a semiconductor package or a component including such semiconductor devices, or a circuit board such as a printed wiring board or an interposer or a component including such circuit boards, or the like is used. Similarly, various kinds of electronic components are used as the electronic component 190 of the electronic device 200. As the various kinds of electronic components, a semiconductor device such as a semiconductor chip or a semiconductor package or a component including such semiconductor devices, or a circuit board such as a printed wiring board or an interposer or a component including such circuit boards, or the like is used. It is to be noted that, in the electronic component 180 and the electronic component 190, a component obtained by turning semiconductor devices included in one board into an individual piece, this board before the turning into an individual piece, a component obtained by turning circuit boards included in one board into an individual piece, and this board before the turning into an individual piece are included.

Examples of the combination between the electronic component 180 and the electronic component 190 that are coupled include combinations between a semiconductor chip and a circuit board, between a semiconductor package and a circuit board, between a semiconductor chip and a semiconductor package, between semiconductor chips, between semiconductor packages, and between circuit boards. Furthermore, the electronic component 180 and the electronic component 190 that are coupled may be a combination between components after turning into an individual piece, or between a component before turning into an individual piece and a component after turning into an individual piece, or between components before turning into an individual piece. If a component before turning into an individual piece and a component after turning into an individual piece are coupled or if components before turning into an individual piece are coupled, the individual electronic device 200 may be obtained by turning the components into an individual piece after the coupling.

Furthermore, electronic components such as the electronic components 190 may be coupled onto one electronic component such as the electronic component 180. In addition, a structure including the above-described waveguide 210, transducing part 220, and transducing part 230 may be provided between the electronic component 180 and each of the electronic components 190.

Moreover, between the electronic component 180 and the electronic component 190 that are coupled, one structure or plural structures may be provided as the structure including the above-described waveguide 210, transducing part 220, and transducing part 230.

Techniques like those described in the above first to third embodiments may be employed for coupling between a printed wiring board and an MMIC chip or for coupling of various kinds of electronic components similarly.

Furthermore, the electronic devices 1, 1A, 1B, and 200 and so forth for which the above-described techniques are employed may be used for various kinds of electronic equipment. These electronic devices may be used for various kinds of electronic equipment such as computers (personal computers, super computers, servers, and so forth), smartphones, mobile phones, tablet terminals, sensors, cameras, audio equipment, measurement devices, test devices, and manufacturing devices.

Figure 18:
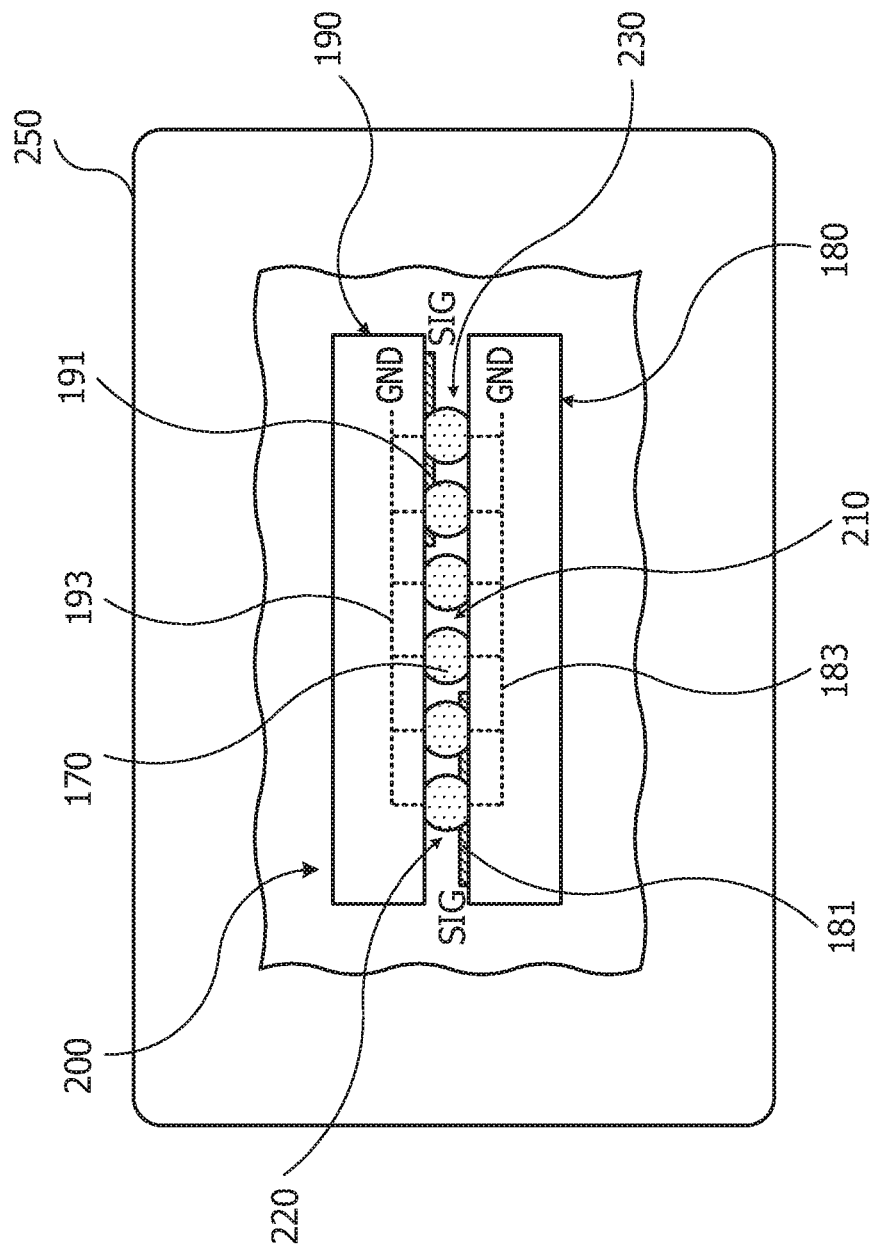
FIG. 18 depicts a diagram illustrating a configuration example of electronic equipment.

FIG. 18 depicts a diagram illustrating a configuration example of electronic equipment.

In FIG. 18, one example of electronic equipment is schematically represented. As illustrated in FIG. 18, for example, the electronic device 200 illustrated in the above-described FIG. 17 is mounted (incorporated) in various kinds of electronic equipment 250 like those exemplified above.

In the electronic device 200, the waveguide 210 is formed by using the coupling parts 100 that couple the electronic component 180 and the electronic component 190 electrically and mechanically, and so forth and signal transmission between the signal line 181 and the signal line 191 that are separate is carried out. According to the electronic device 200, with suppression of miniaturization of the coupling parts 100 between the electronic component 180 and the electronic component 190 and so forth, signal transmission with low loss between the signal line 181 and the signal line 191 that are not directly coupled physically is realized. The electronic equipment 250 that is equipped with such an electronic device 200 and allows signal transmission with low loss is realized.

Although a description is made by taking the electronic device 200 as an example here, various kinds of electronic equipment equipped with other electronic devices 1, 1A, and 1B are also similarly realized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device, comprising:
   a printed wiring board that includes
      a first dielectric layer,
      a first conductor layer formed on an upper surface of the first dielectric layer and has a loop pattern shape with a first opening,
      a first signal line formed in the first opening and on the upper surface of the first dielectric layer, and
      a first ground conductor layer formed on a lower surface of the first dielectric layer;
   a semiconductor chip mounted over the printed wiring board that includes
      a second ground conductor layer formed on a lower surface of the semiconductor chip, a second dielectric layer formed on a lower surface of the second ground conductor layer, a second conductor layer formed on a lower surface of the second dielectric layer and has a loop pattern shape with a second opening, a second signal line formed in the second opening and on the lower surface of the second dielectric layer; and a plurality of coupling parts arranged between the first conductor layer and the second conductor layer that couple the first conductor layer and the second conductor layer, wherein a waveguide is formed by the first ground conductor layer, the second ground conductor layer, and the plurality of coupling parts, and the first signal line and the second signal line are located opposite to each other across the waveguide and electrically isolated from each other.

2. The electronic device according to claim 1, wherein the plurality of coupling parts couples the semiconductor chip and the printed wiring board electrically and mechanically.

3. The electronic device according to claim 2, wherein solder is used for the plurality of coupling parts.

4. The electronic device according to claim 2, wherein a post is used for the plurality of coupling parts.

* * * * *